(12) United States Patent
Kunikiyo

(10) Patent No.: US 6,465,335 B1
(45) Date of Patent: Oct. 15, 2002

(54) METHOD OF MANUFACTURING SEMICONDUCTOR DEVICE

(75) Inventor: Tatsuya Kunikiyo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/690,836

(22) Filed: Oct. 18, 2000

(30) Foreign Application Priority Data

May 16, 2000 (JP) ......................................... 2000-143277

(51) Int. Cl.$^7$ .......................................... H01L 21/4763
(52) U.S. Cl. ..................... 438/592; 438/653; 438/659; 438/532
(58) Field of Search ................................ 438/592, 532, 438/652–659

(56) References Cited

U.S. PATENT DOCUMENTS

| | | | |
|---|---|---|---|
| 5,095,358 A | | 3/1992 | Aronowitz et al. |
| 5,108,954 A | | 4/1992 | Sandhu et al. |
| 6,284,635 B1 | * | 9/2001 | Jang ............................ 438/592 |
| 6,291,868 B1 | * | 9/2001 | Weimer et al. ............. 257/413 |
| 6,333,244 B1 | * | 12/2001 | Yu .............................. 257/410 |

FOREIGN PATENT DOCUMENTS

JP  7-202178  8/1995

OTHER PUBLICATIONS

Byung Hak Lee, et al, "In–Situ Barrier formation for High Reliable W/Barrier/Poly–Si Gate Using Denudation of $WN_x$ On Polycrystalline SI", IEEE, 1998, pp. 385–388.

U.S. patent application Ser. No. 09/612,960. filed Jul. 10, 2000, pending.

U.S. patent application Ser. No. 09/755,119, filed Jan. 8, 2001, pending.

* cited by examiner

Primary Examiner—Tuan H. Nguyen
Assistant Examiner—Thanh Nguyen
(74) Attorney, Agent, or Firm—Oblon, Spivak, McClelland, Maier & Neustadt, P.C.

(57) ABSTRACT

A silicon oxide film and a doped polysilicon film are successively formed on a silicon substrate. Then, a doped polysilicon-germanium film is formed on the doped polysilicon film as a film having a higher impurity activation rate than polysilicon. Then, a barrier film, a metal film and another barrier film are successively formed on the doped polysilicon-germanium film. Thus obtained is a method of manufacturing a semiconductor device comprising a polymetal gate capable of suppressing increase of gate resistance also when an impurity introduced into a semiconductor film diffuses into the barrier films.

7 Claims, 25 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device and a structure of a semiconductor device, and more particularly, it relates to a method of forming a gate electrode of a MISFET (metal insulator semiconductor field-effect transistor) and a structure thereof.

2. Description of the Background Art

The gate length of a MISFET is reduced following refinement of a semiconductor device, while sheet resistance as well as contact resistance of a gate electrode are increased. When such resistance is increased, the operating speed of a circuit is slowed down and the following problem is caused: In a DRAM (dynamic random access memory), for example, the length of word lines must be reduced in order to compensate for increase of wiring resistance resulting from reduction of a wiring sectional area, and hence the number of memory cells connectable to each word line is reduced. Therefore, the number of necessary sectional word lines as well as the number of peripheral circuits such as sense amplifiers are increased, leading to the increase of the chip area. Consequently, the number of chips per wafer is reduced, resulting in increase of the manufacturing cost.

Therefore, a conventional MISFET uses a gate electrode (the so-called polycide gate) having a two-layer structure of a doped polysilicon layer and a metal silicide layer exhibiting smaller gate resistance than a gate electrode (the so-called polysilicon gate) consisting of only doped polysilicon. For example, a gate electrode having a two-layer structure of a doped polysilicon layer and a cobalt silicide (CoSi$_2$) layer or a two-layer structure of a doped polysilicon layer and a tungsten silicide (WSi$_x$(2.2≦x≦2.7)) layer is used.

In a refined MISFET having a gate length of not more than 0.12 μm, however, it is impossible to sufficiently speed up circuit operations by refining the semiconductor device due to large gate resistance also when its gate electrode is formed by a polycide gate. To this end, a gate electrode (the so-called polymetal gate) having a three-layer structure of a polysilicon layer, a barrier layer and a metal layer having smaller gate resistance than the polycide gate has been proposed.

FIG. 29 is a sectional view showing the structure of a conventional semiconductor device comprising a polymetal gate. A multilayer structure obtained by stacking a doped polysilicon layer 102, a barrier layer 103, a metal layer 104, another barrier layer 105 and an insulating layer 106 in this order is formed on the upper surface of a silicon substrate 100 through a gate insulator film 101. FIG. 29 omits illustration of element isolation films and source/drain regions.

An impurity is introduced into the doped polysilicon layer 102 in a high concentration (about 1×10$^{20}$ to 8×10$^{20}$/cm$^3$). More specifically, an n-type impurity such as phosphorus or arsenic is introduced in a surface channel N-type MOSFET or a buried channel P-type MOSFET, while a p-type impurity such as boron is introduced in a surface channel P-type MOSFET or a buried channel N-type MOSFET.

The metal layer 104 is prepared from tungsten or the like, and the barrier layer 103 is prepared from a barrier metal consisting of a metal nitride such as tungsten nitride (WN) or titanium nitride (TiN). When silicon atoms contained in the doped polysilicon layer 102 and metal atoms contained in the metal layer 104 mutually diffuse/react due to heat treatment to form metal silicide in the vicinity of the interface between these layers 102 and 104, the metal silicide is formed in part of the metal layer 104 since the metal silicide has higher resistance than the metal to increase the resistance of the polymetal gate as a whole. The barrier layer 103 is provided in order to suppress occurrence of such a phenomenon.

However, the conventional semiconductor device comprising the polymetal gate shown in FIG. 29 has the following problems: As hereinabove described, the doped polysilicon layer 102 is doped with the impurity in a high concentration. When heat treatment is performed during steps of manufacturing the semiconductor device, however, the impurity introduced into the doped polysilicon layer 102 in the vicinity of the interface between the same and the barrier layer 103 thermally diffuses into the barrier layer 103. Further, the impurity introduced into the doped polysilicon layer 102 in the vicinity of the interface between the same and the gate insulator film 101 thermally diffuses into the gate insulator film 101. Consequently, the impurity concentration of the doped polysilicon layer 102 is reduced in the vicinity of each of the aforementioned interfaces to cause partial depletion of the layer doped with the impurity, and hence resistance is increased in this portion. Consequently, the resistance of the polymetal gate is also increased as a whole.

When the metal atoms contained in the barrier layer 103 diffuse into the doped polysilicon layer 102 due to heat treatment or the silicon atoms contained in the doped polysilicon layer 102 diffuse into the barrier layer 103 due to heat treatment, the silicon atoms and the metal atoms react with each other to form metal silicide. While there is no problem if the metal silicide is homogeneously formed around the interface between the doped polysilicon layer 102 and the barrier layer 103, such metal silicide is partially formed in practice. Therefore, the contact resistance on the aforementioned interface is locally increased to disadvantageously increase the resistance of the overall polymetal gate. This problem can also be caused when the metal atoms contained in the metal layer 104 and the silicon atoms contained in the doped polysilicon layer 102 pass through the barrier layer 103 to diffuse to each other.

SUMMARY OF THE INVENTION

According to a first aspect of the present invention, a method of manufacturing a semiconductor device comprises steps of (a) forming a gate insulator film on a main surface of a semiconductor substrate, (b) forming a first semiconductor film on the gate insulator film which is doped with a prescribed impurity and having at least partially a layer consisting of a material having a higher impurity activation rate than polysilicon, (c) forming a barrier film on the first semiconductor film, (d) forming a metal film on the barrier film and (e) selectively removing the metal film, the barrier film and the first semiconductor film in this order thereby forming a gate electrode.

According to the first aspect, resistance of the gate electrode can be reduced as compared with the case of forming the gate electrode by a first semiconductor film consisting of only polysilicon.

According to a second aspect of the present invention, the first semiconductor film entirely consisting of the layer is formed in the step (b).

According to the second aspect, resistance of the gate electrode can be reduced as compared with the case of forming the gate electrode by a first semiconductor film partially having a layer consisting of a material having a higher impurity activation rate than polysilicon.

According to a third aspect of the present invention, the step (b) includes steps of (b-1) forming a second semiconductor film consisting of the material as the layer and (b-2) forming a third semiconductor film different in impurity activation rate from the second semiconductor film.

According to the third aspect, the threshold voltage of a transistor can be adjusted by adjusting the ratio of the thickness of the second semiconductor film to that of the third semiconductor film.

According to a fourth aspect of the present invention, the second semiconductor film is formed in at least either a part including the interface between the same and the barrier film or a part including the interface between the same and the gate insulator film.

According to the fourth aspect, partial depletion of the layer doped with the impurity can be avoided in the second semiconductor film around the interface between the same and the barrier film by forming the second semiconductor film on the part including the interface. Further, partial depletion of the layer doped with the impurity can be avoided in the second semiconductor film in the vicinity of the interface between the same and the gate insulator film by forming the second semiconductor film on the part including the interface.

According to a fifth aspect of the present invention, the method of manufacturing a semiconductor device further comprises a step (f) of introducing noble gas atoms into the first semiconductor film in the vicinity of the interface between the same and the barrier film.

According to the fifth aspect, formation of a metal-semiconductor alloy can be suppressed in the first semiconductor film also when metal atoms contained in the barrier film or the metal film diffuse into the first semiconductor film.

According to a sixth aspect of the present invention, the method of manufacturing a semiconductor device further comprises a step (g) of introducing noble gas atoms into the metal film in the vicinity of the interface between the same and the barrier film.

According to the sixth aspect, formation of a metal-semiconductor alloy can be suppressed in the metal film also when semiconductor atoms contained in the first semiconductor film diffuse into the metal film.

According to a seventh aspect of the present invention, the method of manufacturing a semiconductor device further comprises a step (g) carried out in advance of the step (d) for introducing noble gas atoms into the barrier film.

According to the seventh aspect, formation of a metal-semiconductor alloy can be suppressed in the barrier film also when the semiconductor atoms contained in the first semiconductor film diffuse into the barrier film.

According to an eighth aspect of the present invention, the noble gas atoms are introduced into the barrier film by ion implantation in the step (h).

According to the eighth aspect, the barrier film approaches an amorphous state, whereby a metal film having a large crystal grain size can be formed on the barrier film. Consequently, resistance of the metal film can be reduced.

According to a ninth aspect of the present invention, the layer is an $Si_{1-x}Ge_x$ layer having a composition ratio of $0.2 \leq x \leq 0.4$.

According to a tenth aspect of the present invention, a method of manufacturing a semiconductor device comprises steps of (a) forming a gate insulator film on a main surface of a semiconductor substrate, (b) forming a semiconductor film on the gate insulator film which is doped with a prescribed impurity, (c) forming a barrier film on the semiconductor film, (d) forming a metal film on the barrier film, (e) introducing noble gas atoms into at least one of the semiconductor film in the vicinity of the interface between the same and the barrier film, the metal film in the vicinity of the interface between the same and the barrier film and the barrier film, and (f) selectively removing the metal film, the barrier film and the semiconductor film in this order thereby forming a gate electrode.

According to the tenth aspect, formation of a metal-semiconductor alloy can be suppressed in the semiconductor film also when metal atoms contained in the barrier film or the metal film diffuse into the semiconductor film, by introducing the noble gas atoms into the semiconductor film in the vicinity of the interface between the same and the barrier film.

Further, formation of a metal-semiconductor alloy can be suppressed in the metal film also when semiconductor atoms contained in the semiconductor film diffuse into the metal film, by introducing the noble gas atoms into the metal film in the vicinity of the interface between the same and the barrier film.

In addition, formation of a metal-semiconductor alloy can be suppressed in the barrier film also when the semiconductor atoms contained in the first semiconductor film diffuse into the barrier film, by introducing the noble gas atoms into the barrier film.

According to an eleventh aspect of the present invention, the noble gas atoms are introduced at least into the barrier film in the step (e), the noble gas atoms are introduced into the barrier film by ion implantation in the step (d), and the step (e) is carried out after the step (d).

According to the eleventh aspect, the barrier film approaches an amorphous state, whereby a metal film having a large crystal grain size can be formed on the barrier film. Consequently, resistance of the metal film can be reduced.

According to a twelfth aspect of the present invention, a semiconductor device comprises a substrate, a gate insulator film formed on a main surface of the substrate, and a gate electrode stacked with a first semiconductor layer doped with a prescribed impurity, a barrier layer and a metal layer in this order and formed on the gate insulator film, and a second semiconductor layer consisting of a material having a higher impurity activation rate than polysilicon is formed at least partially in the first semiconductor layer.

According to the twelfth aspect, resistance of the gate electrode can be reduced as compared with a semiconductor device comprising a gate electrode having a first semiconductor layer consisting of only polysilicon.

According to a thirteenth aspect of the present invention, the first semiconductor layer is entirely formed by the second semiconductor layer.

According to the thirteenth aspect, resistance of the gate electrode can be reduced as compared with a semiconductor device comprising a gate electrode having a second semiconductor layer partially formed in a first semiconductor layer.

According to a fourteenth aspect of the present invention, a third semiconductor layer different in impurity activation rate from the second semiconductor layer is further formed in the first semiconductor layer.

According to the fourteenth aspect, the threshold voltage of a transistor can be set by adjusting the ratio of the thickness of the second semiconductor layer to that of the third semiconductor layer.

According to a fifteenth aspect of the present invention, the second semiconductor layer is formed in at least either a part including the interface between the first semiconductor layer and the barrier layer or a part including the interface between the first semiconductor layer and the gate insulator film.

According to the fifteenth aspect, partial depletion of the layer doped with the impurity can be avoided in the second semiconductor layer in the vicinity of the interface between the first semiconductor layer and the barrier layer when the second semiconductor layer is formed in a part including the interface.

When the second semiconductor layer is formed in a part including the interface between the first semiconductor layer and the gate insulator film, partial depletion of the layer doped with the impurity can be avoided in the second semiconductor layer in the vicinity of the interface.

According to a sixteenth aspect of the present invention, the semiconductor device further comprises a noble gas atom introduction layer formed in at least one of the first semiconductor layer in the vicinity of the interface between the same and the barrier layer and the metal layer in the vicinity of the interface between the same and the barrier layer.

According to the sixteenth aspect, formation of a metal-semiconductor alloy can be suppressed in the first semiconductor layer also when metal atoms contained in the barrier layer or the metal layer diffuse into the first semiconductor layer, when the noble gas atom introduction layer is formed in the first semiconductor layer in the vicinity of the interface between the same and the barrier layer.

When the noble gas atom introduction layer is formed in the metal layer in the vicinity of the interface between the same and the barrier layer, formation of a metal-semiconductor alloy can be suppressed in the metal layer also when the semiconductor atoms contained in the first semiconductor layer diffuse into the metal layer.

According to a seventeenth aspect of the present invention, the second semiconductor layer is an $Si_{1-x}Ge_x$ layer having a composition ratio of $0.2 \leq x \leq 0.4$.

According to an eighteenth aspect of the present invention, a semiconductor device comprises a substrate, a gate electrode stacked with a semiconductor layer doped with an impurity, a barrier layer and a metal layer in this order and selectively formed on a main surface of the substrate through a gate insulator film, and a noble gas atom introduction layer formed in at least one of the semiconductor layer in the vicinity of the interface between the same and the barrier layer and the metal layer in the vicinity of the interface between the same and the barrier layer.

According to the eighteenth aspect, formation of a metal-semiconductor alloy can be suppressed in the semiconductor layer also when metal atoms contained in the barrier layer or the metal layer diffuse into the semiconductor layer, when the noble gas atom introduction layer is formed in the semiconductor layer in the vicinity of the interface between the same and the barrier layer.

When the noble gas atom introduction layer is formed in the metal layer in the vicinity of the interface between the same and the barrier layer, formation of a metal-semiconductor alloy can be suppressed in the metal layer also when the semiconductor atoms contained in the semiconductor layer diffuse into the metal layer.

An object of the present invention is to obtain a method of manufacturing a semiconductor device and a structure of a semiconductor device capable of suppressing increase of gate resistance resulting from partial depletion of a layer doped with an impurity also when an impurity introduced into a semiconductor layer diffuses into a barrier layer or a gate insulator film in relation to a semiconductor device comprising a polymetal gate having a multilayer structure obtained by stacking a semiconductor layer, a barrier layer and a metal layer in this order.

Another object of the present invention is to obtain a method of manufacturing a semiconductor device and a structure of a semiconductor device capable of avoiding formation of metal silicide and suppressing increase of gate resistance also when silicon atoms contained in a semiconductor layer diffuse into a barrier layer or a metal layer or metal atoms contained in the barrier layer or the metal layer diffuse into the semiconductor layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1.

FIGS. 1 to 15 are sectional views showing a method of manufacturing a semiconductor device according to an embodiment 1 of the present invention in step order. In the method of manufacturing a semiconductor device according to the embodiment 1, methods of forming element isolation films of an STI (shallow trench isolation) structure or the like, a channel stopper layer, a channel dope layer, a well and the like are similar to well-known methods, and hence redundant description is omitted. Therefore, FIGS. 1 to 15 omit illustration of these elements.

Figure 1:
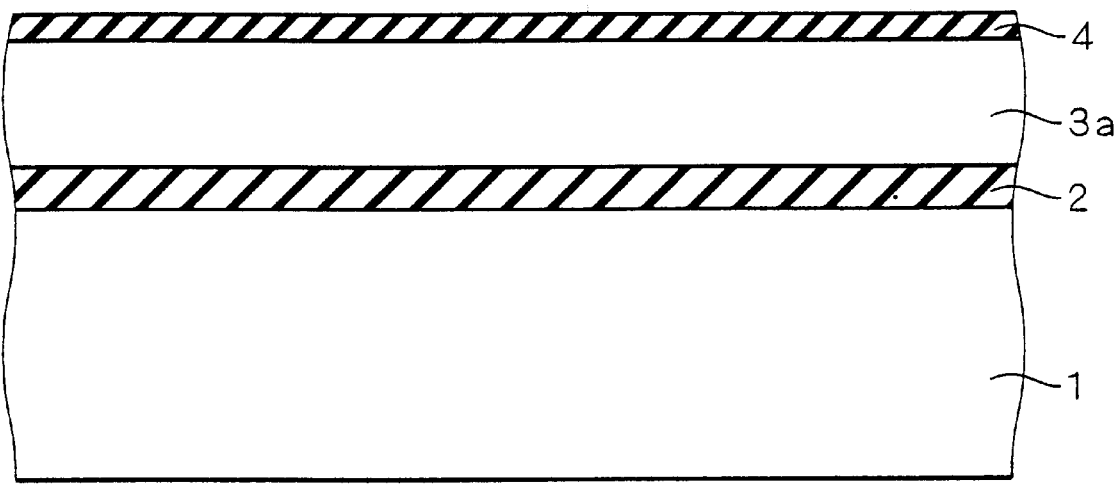
FIGS. 1 to 15 are sectional views showing a method of manufacturing a semiconductor device according to an embodiment 1 of the present invention in step order.

First, a silicon oxide film 2 is formed on the overall surface of a silicon substrate 1 by thermal oxidation or the like. Then, a polysilicon film 3a doped with no impurity is deposited on the overall surface of the silicon oxide film 2 by CVD (chemical vapor deposition) in a thickness of about 40 nm. The polysilicon film 3a is exposed to the air, and hence a native oxide film 4 is formed on its surface (FIG. 1).

Figure 2:
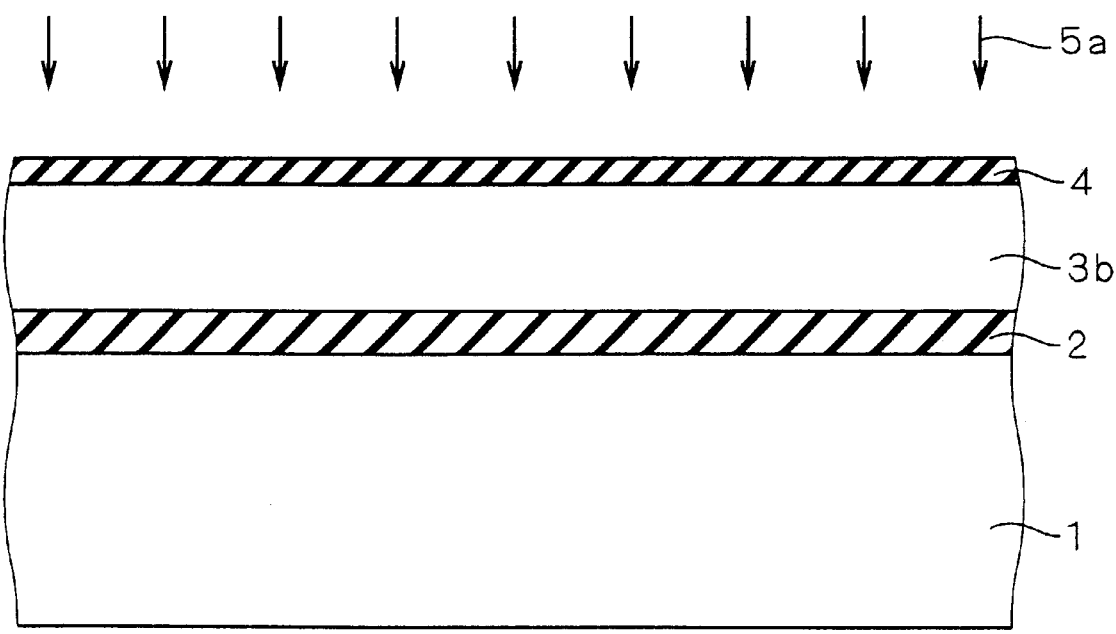

Then, an impurity 5a is introduced into the polysilicon film 3a through the native oxide film 4 by ion implantation. Thus, a doped polysilicon film 3b is obtained from the polysilicon film 3a (FIG. 2). More specifically, an n-type impurity such as phosphorus or arsenic is introduced when forming a surface channel N-type MOSFET or a buried channel P-type MOSFET, while a p-type impurity such as boron is introduced when forming a surface channel P-type MOSFET or a buried channel N-type MOSFET. The concentration of the impurity 5a in the doped polysilicon film 3b is about $1 \times 10^{20}$ to $8 \times 10^{20}/cm^3$.

When impurities 5a of different conductivity types must be introduced into the polysilicon film 3a for forming a surface channel N-type MOSFET and a surface channel P-type MOSFET on different portions of the silicon substrate 1, for example, a patterned photoresist film may be employed as an implantation mask for selectively performing ion implantation.

When impurities 5a of the same conductivity type may be introduced into the polysilicon film 3a for forming a surface channel N-type MOSFET and a buried channel P-type MOSFET on different portions of the silicon substrate 1, for example, ion implantation may be collectively performed on the overall surface of a wafer without employing an implantation mask. In this case, the impurities 5a may not be introduced by ion implantation but gas of the impurities 5a may be mixed into raw material gas when depositing the polysilicon film 3a by CVD for forming the doped polysilicon film 3b by deposition.

Then, the native oxide film 4 is removed by wet etching employing a hydrofluoric acid solution for exposing the upper surface of the doped polysilicon film 3b. When the native oxide film 4 cannot be completely removed by only wet etching, the remaining part of the native oxide film 4 may be completely removed by sputter etching in an argon atmosphere.

Figure 3:
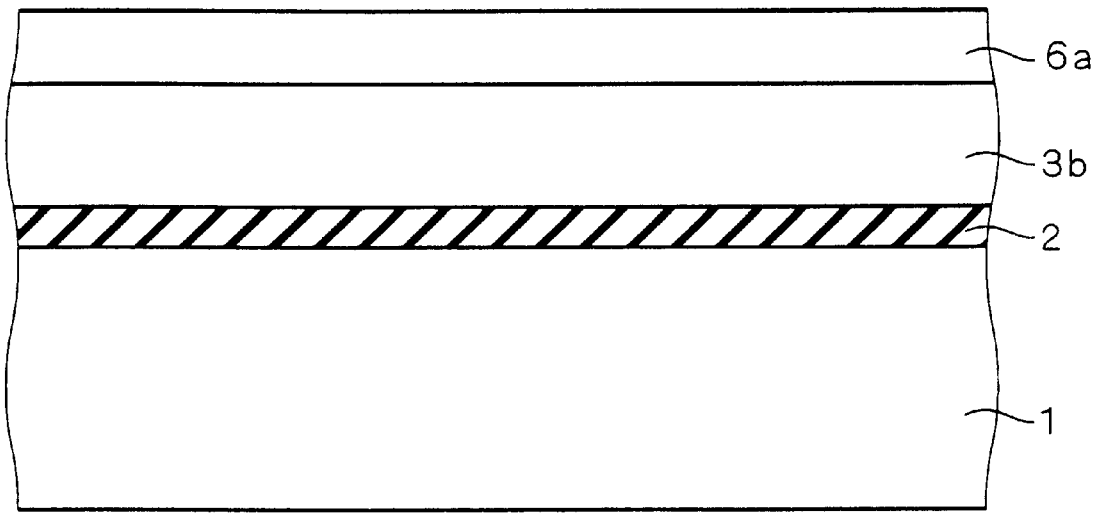

Then, a polysilicon-germanium film 6a doped with no impurity is deposited on the overall surface of the doped polysilicon film 3b by LPCVD (low-pressure CVD) in a thickness of about 20 nm as a film having a higher impurity activation rate than polysilicon (FIG. 3). The composition ratio of $Si_{1-x}Ge_x$ can be adjusted by controlling the temperature in deposition, the deposition time, the partial pressure of gas, the flow rate of the gas or the like. In relation to such a polysilicon-germanium film, it is known that the impurity activation rate is maximized when $0.2 \leq x \leq 0.4$.

Figure 4:
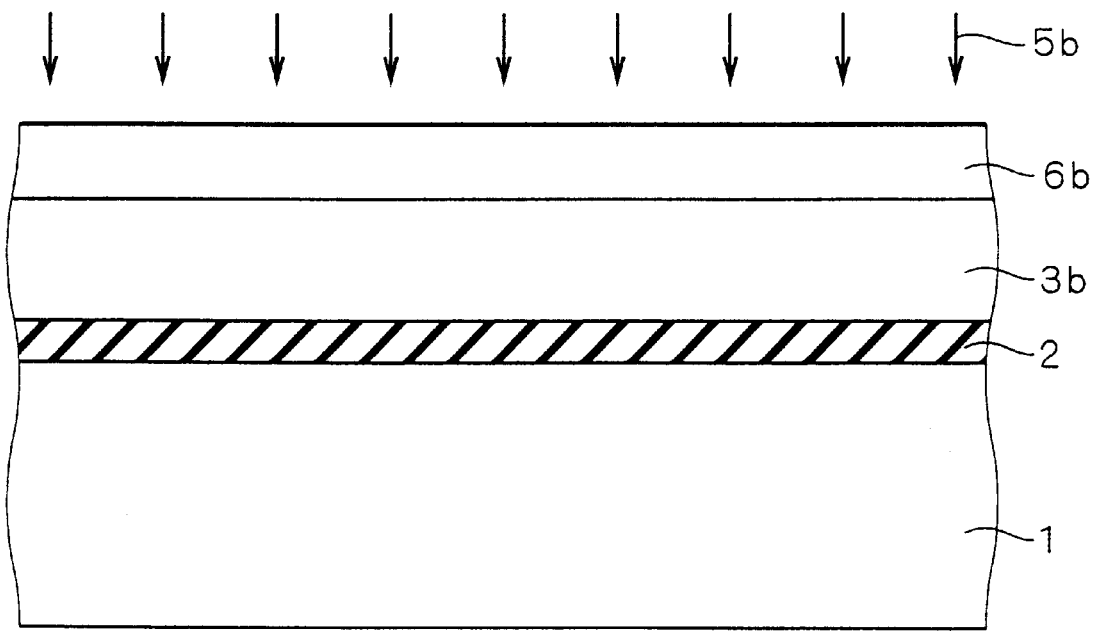

Then, an impurity 5b is introduced into the polysilicon-germanium film 6a by ion implantation, thereby obtaining a doped polysilicon-germanium film 6b from the polysilicon-germanium film 6a (FIG. 4). More specifically, an n-type impurity such as phosphorus or arsenic is introduced when forming a surface channel N-type MOSFET or a buried channel P-type MOSFET, while a p-type impurity such as boron is introduced when forming a surface channel P-type MOSFET or a buried channel N-type MOSFET. The concentration of the impurity 5b in the doped polysilicon-germanium film 6b is about $1 \times 10^{20}$ to $8 \times 10^{21}/cm^3$.

Similarly to the step of forming the doped polysilicon film 3b shown in FIG. 2, ion implantation may be selectively performed through an implantation mask when impurities 5b of different conductivity types must be introduced into the polysilicon-germanium film 6a, while ion implantation may be collectively performed on the overall surface of the wafer when impurities 5b of the same conductivity type may be introduced into the polysilicon-germanium film 6a. In the latter case, gas of the impurities 5b may be mixed into raw material gas when depositing the polysilicon-germanium film 6a by LPCVD for forming the doped polysilicon-germanium film 6b by deposition.

In this case, the native oxide film 4 is completely removed before depositing the polysilicon-germanium film 6a on the doped polysilicon film 3b, whereby interfacial resistance between the doped polysilicon film 3b and the doped polysilicon-germanium film 6b is reduced.

Figure 5:
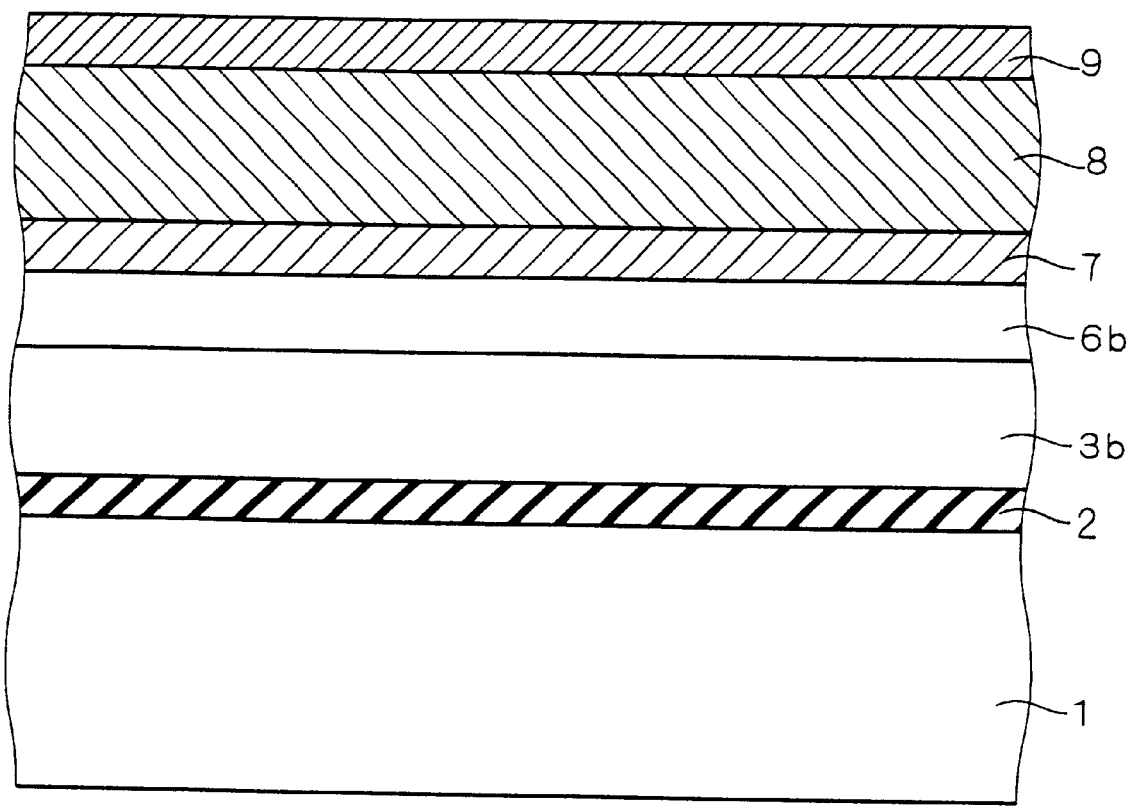

Then, a barrier film 7 is formed on the overall surface of the doped polysilicon-germanium film 6b by PVD (physical vapor deposition) or the like in a thickness of about 10 nm. Then, a metal film 8 is formed on the overall surface of the barrier film 7 by PVD or the like in a thickness of about 100 nm. The material for the metal film 8 is Au, Ag, Cu, Al, W, Mo, Zr, Co, Ni, Ti, Pt or the like. Then, another barrier film 9 is formed on the overall surface of the metal film 8 by PVD or the like in a thickness of about 10 nm (FIG. 5). The barrier films 7 and 9 are prepared from TiN, TiW, WN, Ta, TaN, TaW, TiC, TiCN, TaCN, TaC or the like. The materials for the barrier films 7 and 9 may be identical to or different from each other.

The barrier film 9 mainly prevents the surface of the metal film 8 from oxidation. The barrier film 7 inhibits silicon atoms and germanium atoms contained in the doped polysilicon-germanium film 6b and metal atoms contained in the metal film 8 from diffusing/reacting with each other and forming a metal-Si alloy and a metal-Ge alloy due to various heat treatment performed during the steps of manufacturing the semiconductor device. Thus, gate resistance is inhibited from increase due to formation of the aforementioned alloys in the metal film 8.

Figure 6:
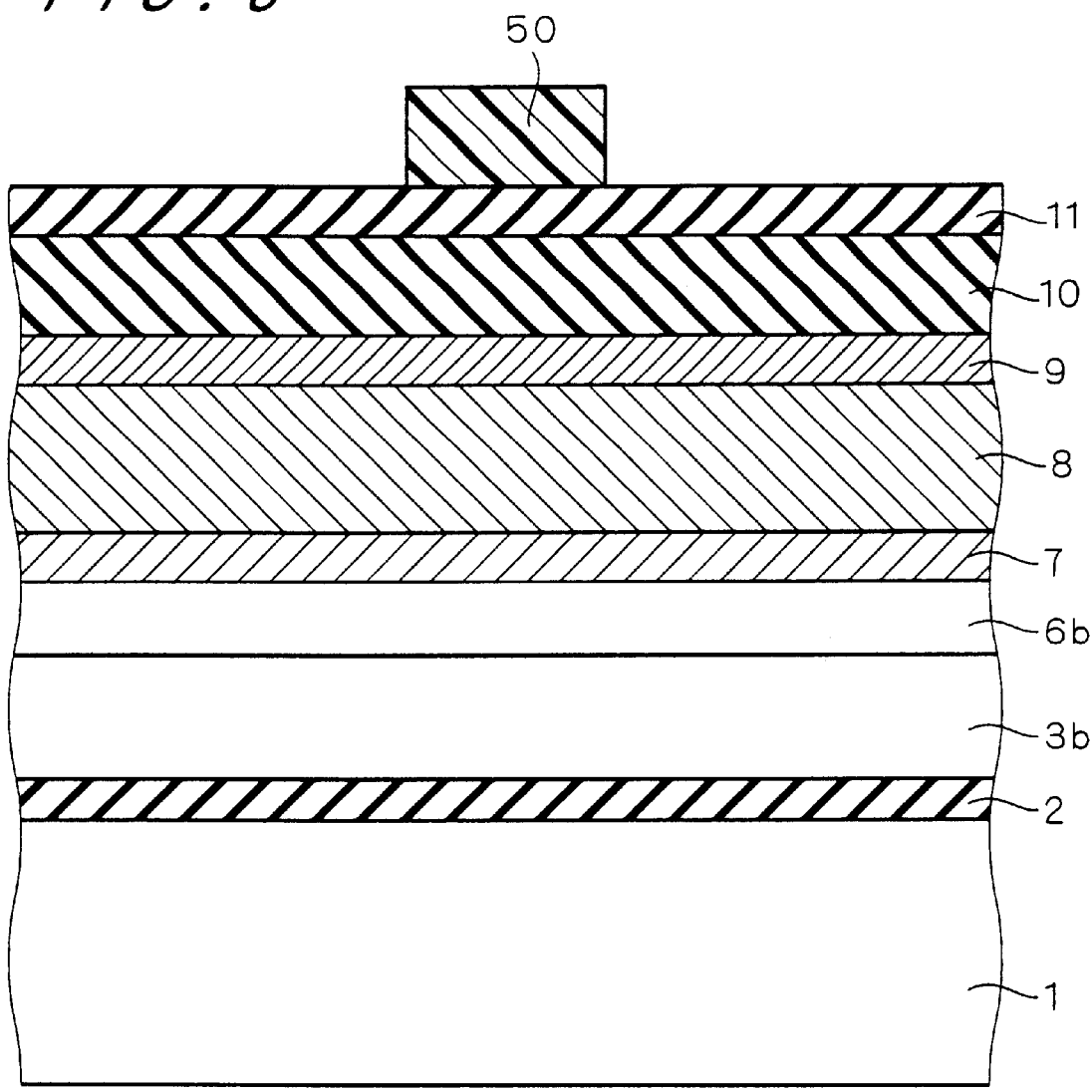

Then, an insulator film 10 is formed on the overall surface of the barrier film 9 by CVD or the like. The material for the insulator film 10 is SiON, $SiO_2$, $Si_3N_4$, TEOS, SiOF, SiOC, SiC or the like. Then, an antireflection coat (ARC) 11 consisting of SiON or the like is formed on the overall surface of the insulator film 10 by plasma CVD. Then, a photoresist film 50 is formed on the upper surface of the ARC 11 above a region for forming a gate electrode later (FIG. 6).

More specifically, the photoresist film 50 is formed by selectively exposing a negative or positive photoresist film formed on the overall surface of the ARC 11 through a photomask having a prescribed mask pattern and dissolving/removing photoresist from parts other than the photoresist film 50. In this case, the ARC 11 is previously formed under the photoresist film 50 and hence it is possible to avoid occurrence of such a phenomenon (halation) that the photoresist is exposed by reflected light from the metal film 8 or the like to blur the contour of the photoresist film 50.

Figure 7:
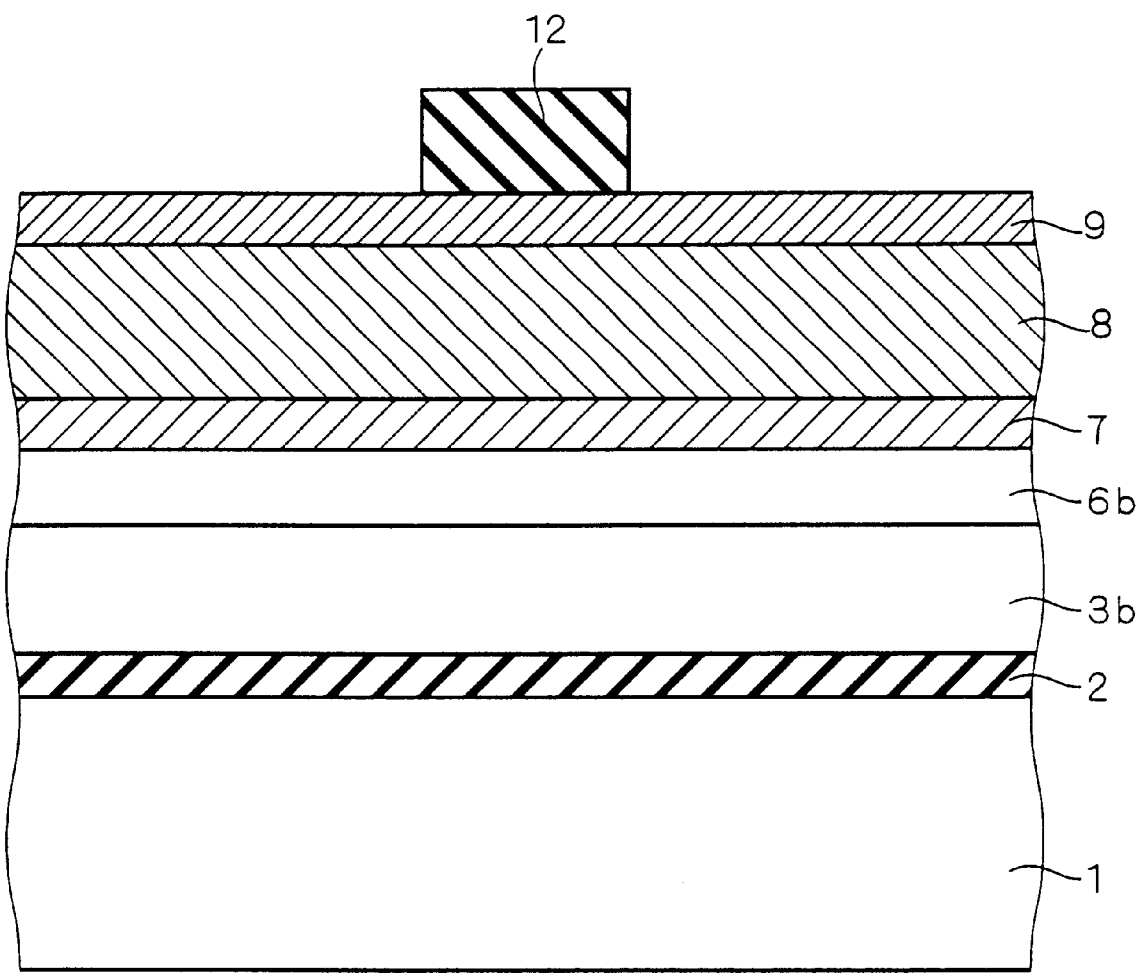

Then, parts of the ARC 11 and the insulator film 10 exposed from the photoresist film 50 are removed in this order by anisotropic etching at a high etching rate along the depth of the silicon substrate 1 through the photoresist film 50 serving as an etching mask, for exposing the upper surface of the barrier film 9. Then, the photoresist film 50 and the ARC 11 located under the same are removed. Thus, an insulator film 12 is obtained as the insulator film 10 left unetched (FIG. 7).

Then, the insulator film 12 is employed as a hard mask for removing parts of the barrier film 9, the metal film 8, the barrier film 7, the doped polysilicon-germanium film 6b, the doped polysilicon film 3b and the silicon oxide film 2 exposed from the insulator film 12 in this order by anisotropic dry etching at a high etching rate along the depth direction of the silicon substrate 1, for exposing the upper surface of the silicon substrate 1. In this anisotropic dry etching step, the silicon oxide film 2 may not be removed.

Thus, a barrier layer 18, a metal layer 17, another barrier layer 16, a doped polysilicon-germanium layer 15a, a doped polysilicon layer 14 and a gate insulator film are obtained as the barrier film 9, the metal film 8, the barrier film 7, the doped polysilicon-germanium film 6b, the doped polysilicon film 3b and the silicon oxide film 2 left unetched respectively.

Figure 8:
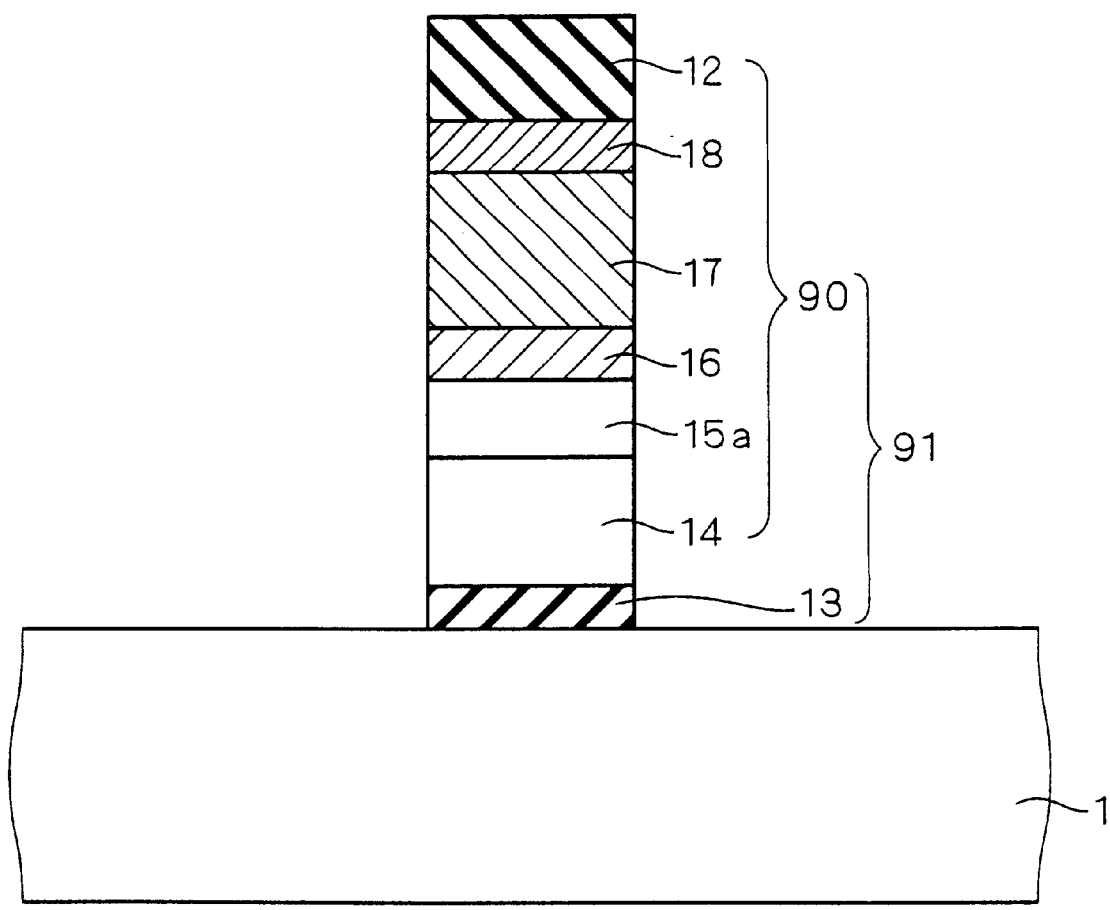

Through the aforementioned steps, it is possible to selectively form a gate structure 91 having the gate insulator film 13 and a gate electrode 90, formed on the gate insulator film 13, having a multilayer structure obtained by stacking the doped polysilicon layer 14, the doped polysilicon-germanium layer 15a, the barrier layer 16, the metal layer 17, the barrier layer 18 and the insulator film 12 in this order on the upper surface of the silicon substrate 1 (FIG. 8). In the gate electrode 90, the doped polysilicon layer 14 and the doped polysilicon-germanium layer 15a function as a semiconductor layer of a polymetal gate.

Figure 9:
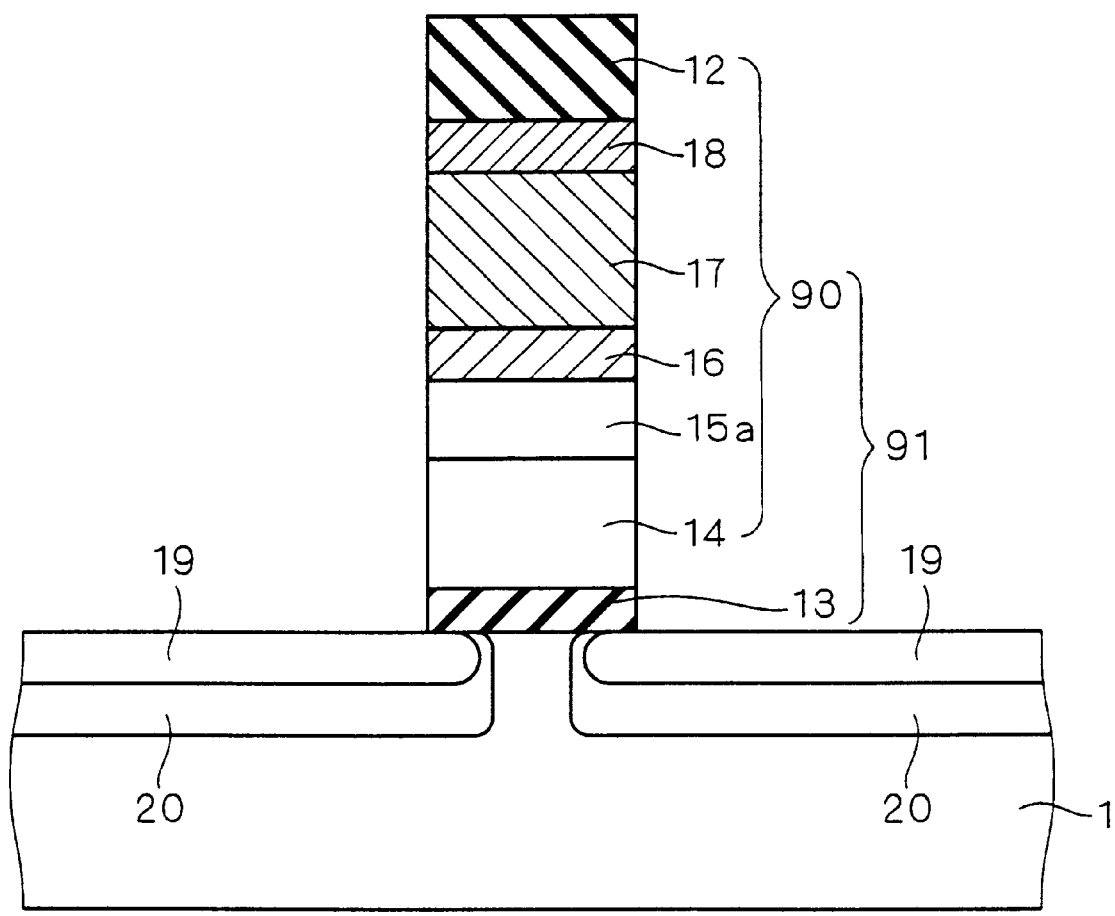

Then, an impurity is introduced into the upper surface of the silicon substrate 1 by ion implantation employing the gate structure 91 as an implantation mask, thereby forming extensions 19. Then, an impurity is introduced into the upper surface of the silicon substrate 1 by ion implantation employing the gate structure 91 as an implantation mask, thereby forming pocket implantation layers 20 (FIG. 9). The impurities for forming the extensions 19 and the pocket implantation layers 20 may alternatively be introduced into the upper surface of the silicon substrate 1 by plasma doping or by employing a cluster ion beam.

The conditions for introducing the impurities for forming the extensions 19 and the pocket implantation layers 20 are decided in response to desired transistor characteristics. When forming an N-type MOSFET, an n-type impurity and a p-type impurity are generally introduced for forming the extensions 19 and the pocket implantation layers 20 respectively. When forming a P-type MOSFET, on the other hand, a p-type impurity and an n-type impurity are generally introduced for forming the extensions 19 and the pocket implantation layers 20 respectively.

Then, the upper surface of the silicon substrate 1 exposed from the gate structure 91 and the side surfaces as well as the upper surface of the gate structure 91 are thermally oxidized. In this specification, this step is referred to as "re-oxidation of the gate". The oxidizing atmosphere may be any of a dry $O_2$ atmosphere, a wet $O_2$ atmosphere, an $HCl/O_2$ atmosphere, an NO atmosphere, an $N_2O$ atmosphere and an $N_2$/dry $O_2$ atmosphere. Thus, etching damages caused on the upper surface of the silicon substrate 1 or the side surfaces of the gate structure 91 in the anisotropic dry etching steps for forming the gate structure 91 can be captured in an oxide film formed by the thermal oxidation. Further, crystal defects caused in the ion implantation steps for forming the extensions 19 and the pocket implantation layers 20 can be recovered.

Figure 10:
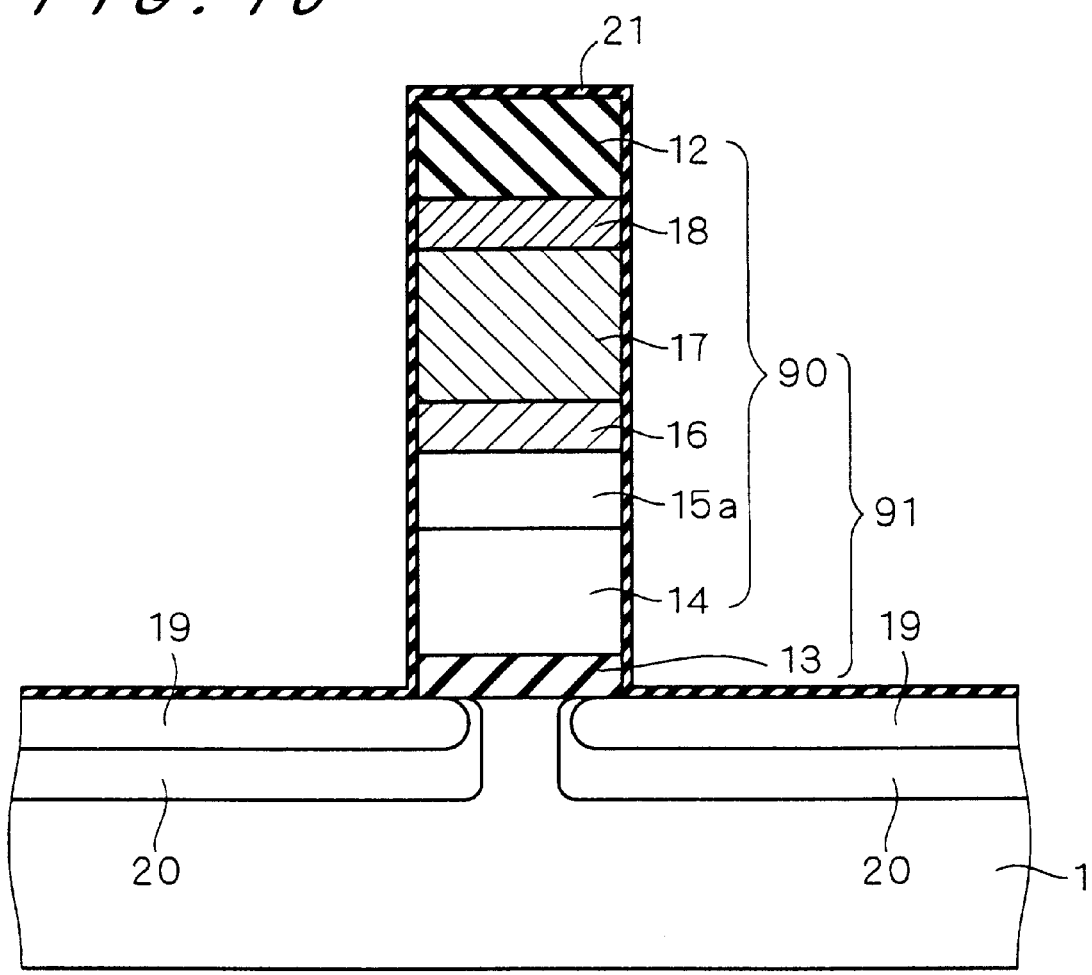

The aforementioned thermal oxidation step may be replaced with the following step: First, RTA (rapid thermal annealing) is performed in an $N_2$ atmosphere for forming insulator films 21 of nitride films on the upper surface of the silicon substrate 1 exposed from the gate structure 91 and the side surfaces as well as the upper surface of the gate structure 91 (FIG. 10). The materials for the insulator films 21 are silicon nitride films in the parts in contact with the upper surface of the silicon substrate 1 and the side surfaces of the doped polysilicon layer 14, nitride films of SiGe in the parts in contact with the side surfaces of the doped polysilicon-germanium layer 15a, and nitride films of a metal in the parts in contact with the side surfaces of the metal layer 17, for example.

Figure 11:
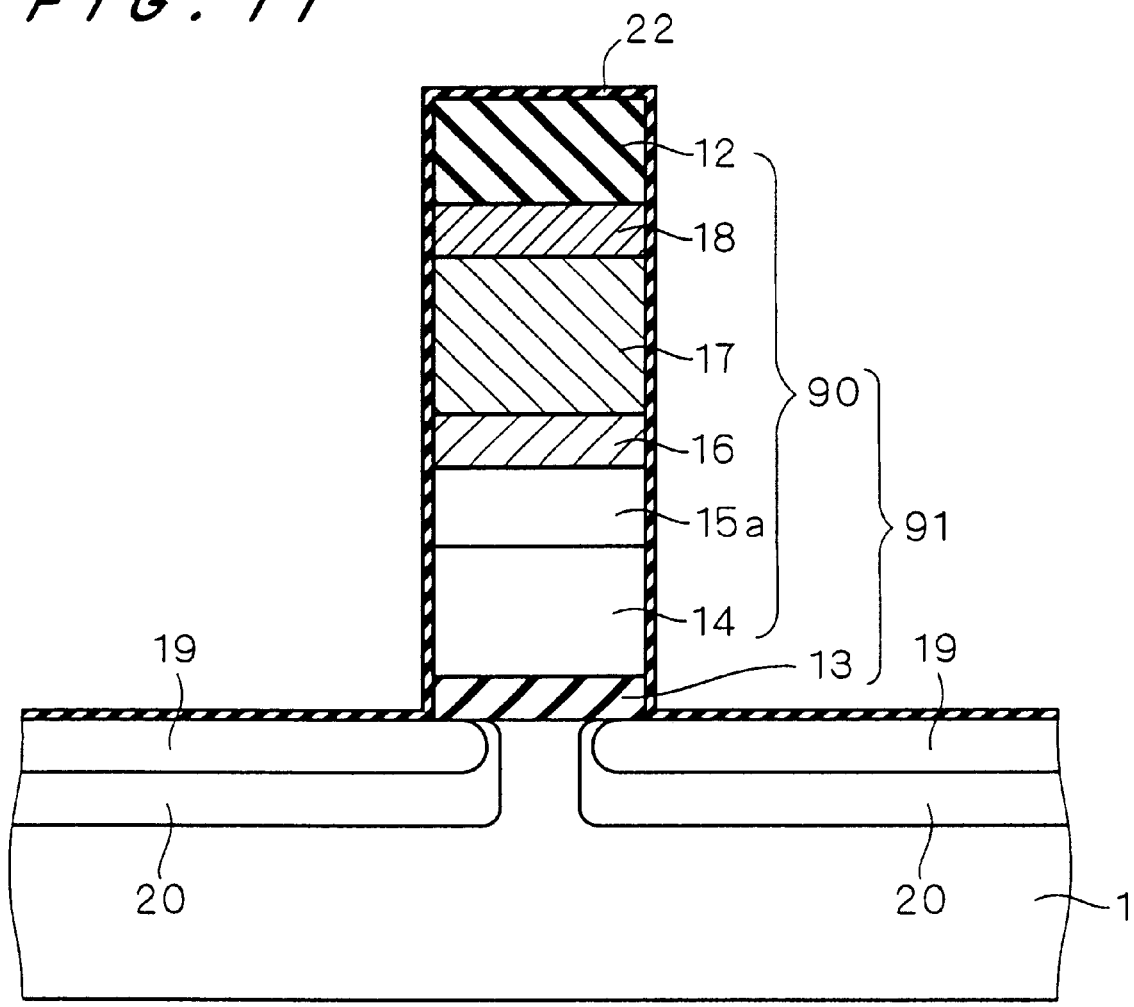

Then, RTO (rapid thermal oxidation) is performed in a dry $O_2$ atmosphere or a wet $O_2$ atmosphere. Consequently, the insulator films 21 consisting of nitride films are oxidized to form an insulator film 22 consisting of an oxynitride film (FIG. 11). Through this step, etching damages caused in the anisotropic dry etching steps for forming the gate structure 91 are captured in the insulator film 22 while crystal defects caused in the ion implantation steps for forming the extensions 19 etc. are recovered as described above.

As shown in FIG. 10, the insulator films 21 consisting of silicon nitride films are formed on the side surfaces of the doped polysilicon-germanium layer 15a and the side surfaces of the doped polysilicon layer 14 respectively. The silicon nitride films, serving as antioxidation films, can prevent the insulator film 22 from being deeply formed in the side surfaces of the doped polysilicon-germanium layer 15a and the doped polysilicon layer 14 in the RTO step. Consequently, it is possible to properly prevent such a phenomenon that gate lengths of the parts formed with the doped polysilicon-germanium layer 15a and the doped polysilicon layer 14 are reduced to increase gate resistance. In place of the aforementioned heat treatment, silicon oxide films of TEOS or the like may be deposited by CVD for forming the insulator films 21 and 22.

The steps of forming the extensions 19 and the pocket implantation layers 20 and the gate re-oxidation step may not be carried out in the aforementioned order but can be performed in arbitrary order.

Figure 12:
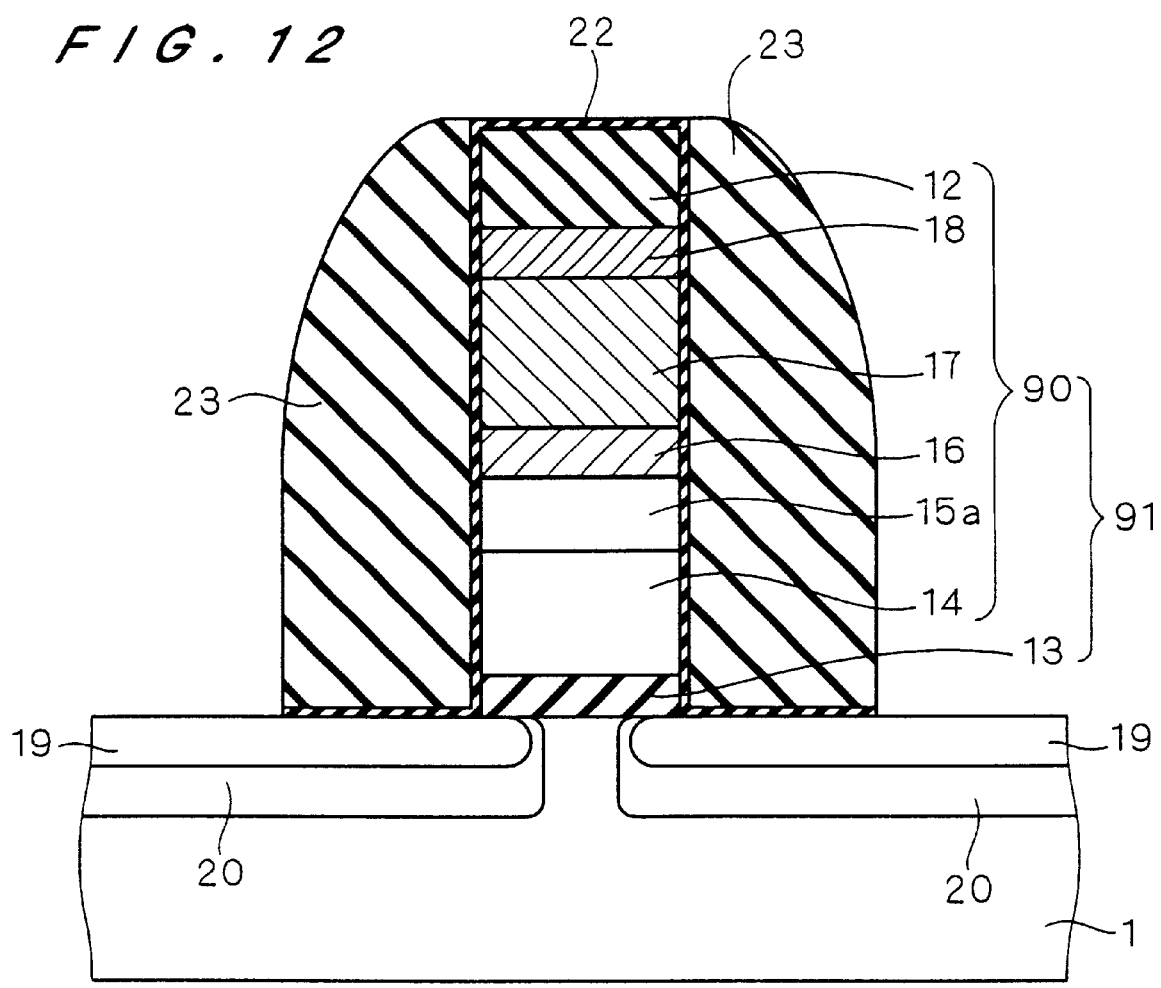

Then, a prescribed insulator film such as a silicon oxide film, a silicon nitride film or a silicon oxynitride film (or a multilayer film of such films) is formed on the overall surface to cover the insulator film 22, and the aforementioned prescribed insulator film is thereafter etched by anisotropic dry etching at a high etching rate along the depth direction of the silicon substrate 1, thereby forming side walls 23. The side walls 23 are formed on the side surfaces of the gate structure 91 in a self-aligned manner. In the insulator film 22 formed on the upper surface of the silicon substrate 1, parts not serving as underlayers for the side walls 23 are removed through the anisotropic dry etching for forming the side walls 23, to expose the upper surface of the silicon substrate 1 (FIG. 12).

Figure 13:
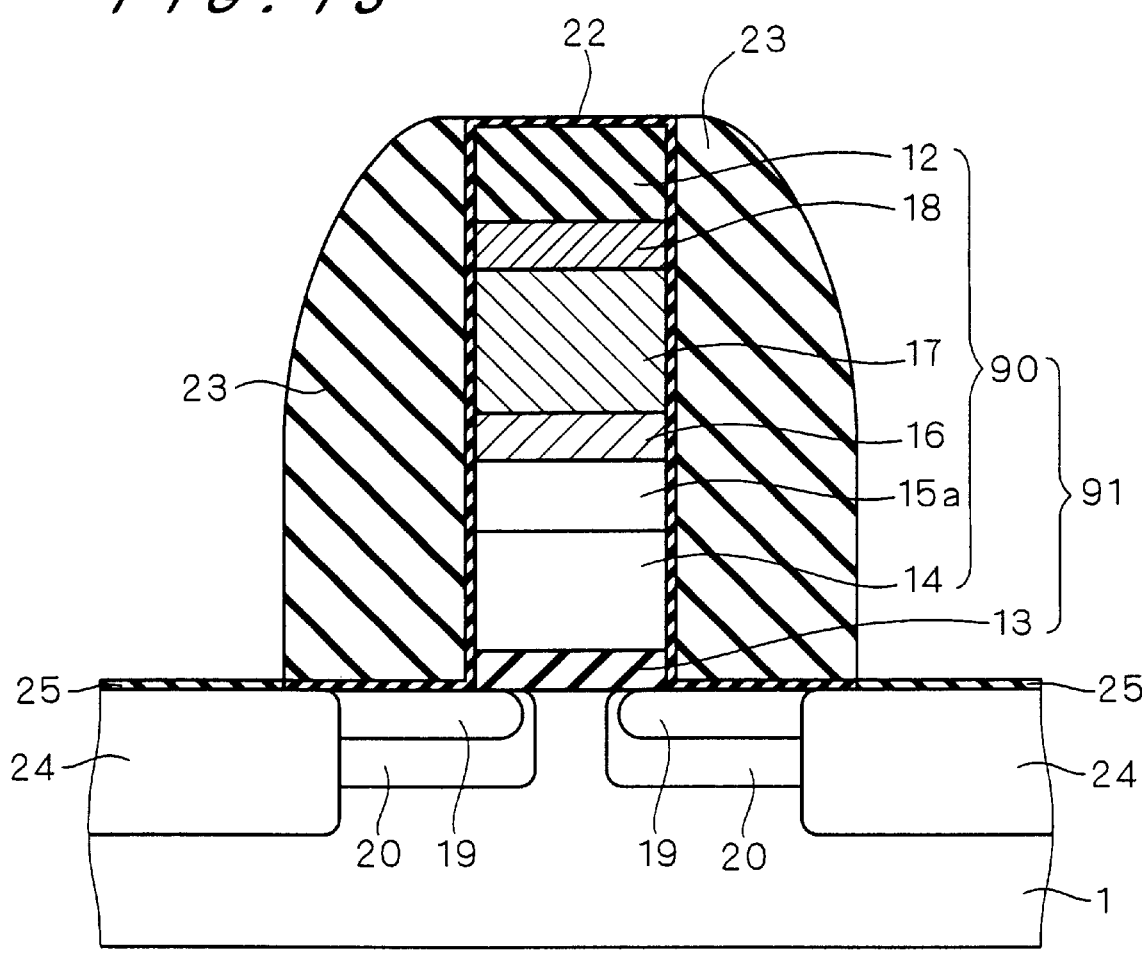

Then, an impurity is introduced into the upper surface of the silicon substrate 1 by ion implantation through the gate structure 91 and the side walls 23 serving as implantation masks and heat treatment is thereafter performed thereby forming source/drain regions 24 to be deeper than the pocket implantation layers 20 in a self-aligned manner. Alternatively, the impurity for forming the source/drain regions 24 may be introduced into the upper surface of the silicon substrate 1 by plasma doping or by employing a cluster ion beam. Native oxide films 25 are formed on parts of the upper surface of the silicon substrate 1 exposed by the anisotropic dry etching for forming the side walls 23 (FIG. 13).

Figure 14:
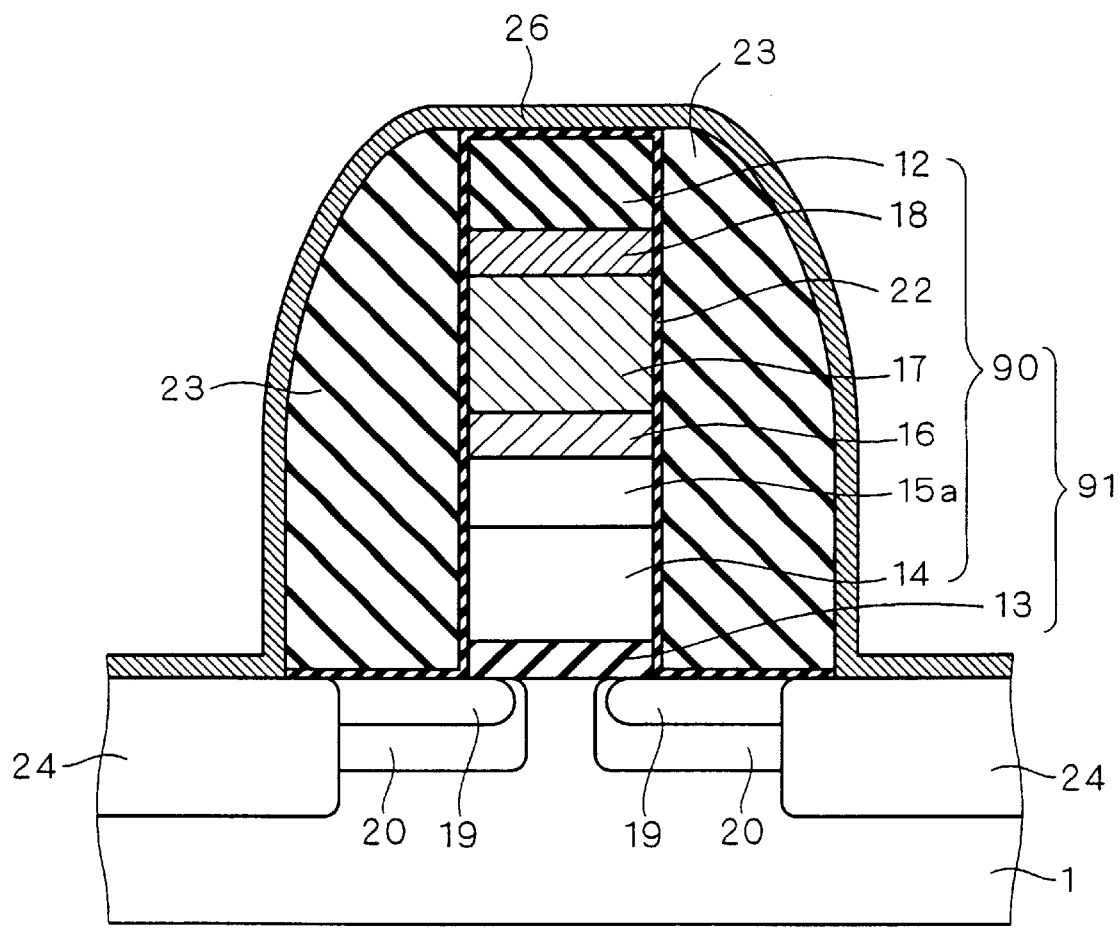

Then, the native oxide films 25 are completely removed by sputter etching in an argon atmosphere. Then, a metal film such as a cobalt film 26 is formed on the overall surface by PVD or the like (FIG. 14).

Figure 15:
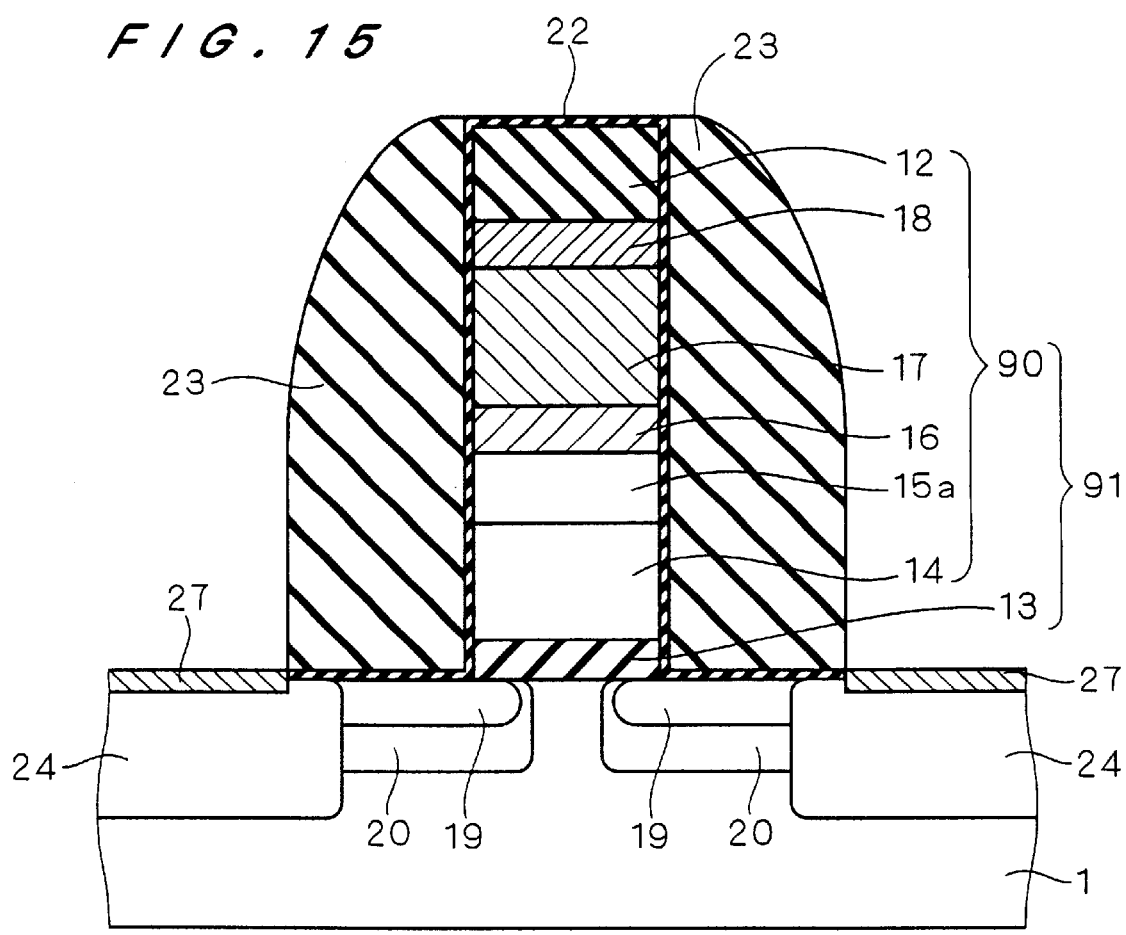

Then, heat treatment (e.g., RTA in a nitrogen atmosphere or an argon atmosphere) is performed for reacting the part of the cobalt film 26 in contact with the upper surface of the silicon substrate 1 with the silicon substrate 1. Thus, cobalt silicide films 27 can be formed on and in the portions of the upper surface of the silicon substrate 1 formed with the source/drain regions 24 in a self-aligned manner. Due to this heat treatment, the parts of the cobalt films 26 in contact with the side walls 23 and the insulator film 22 are converted to cobalt nitride films. Thereafter the cobalt nitride films and the unreacted parts of the cobalt film 26 are removed by etching (FIG. 15). Due to the heat treatment, the impurities introduced into the doped polysilicon layer 14, the doped polysilicon-germanium layer 15a, the extensions 19, the pocket implantation layers 20 and the source/drain regions 24 respectively are activated.

Figure 16:
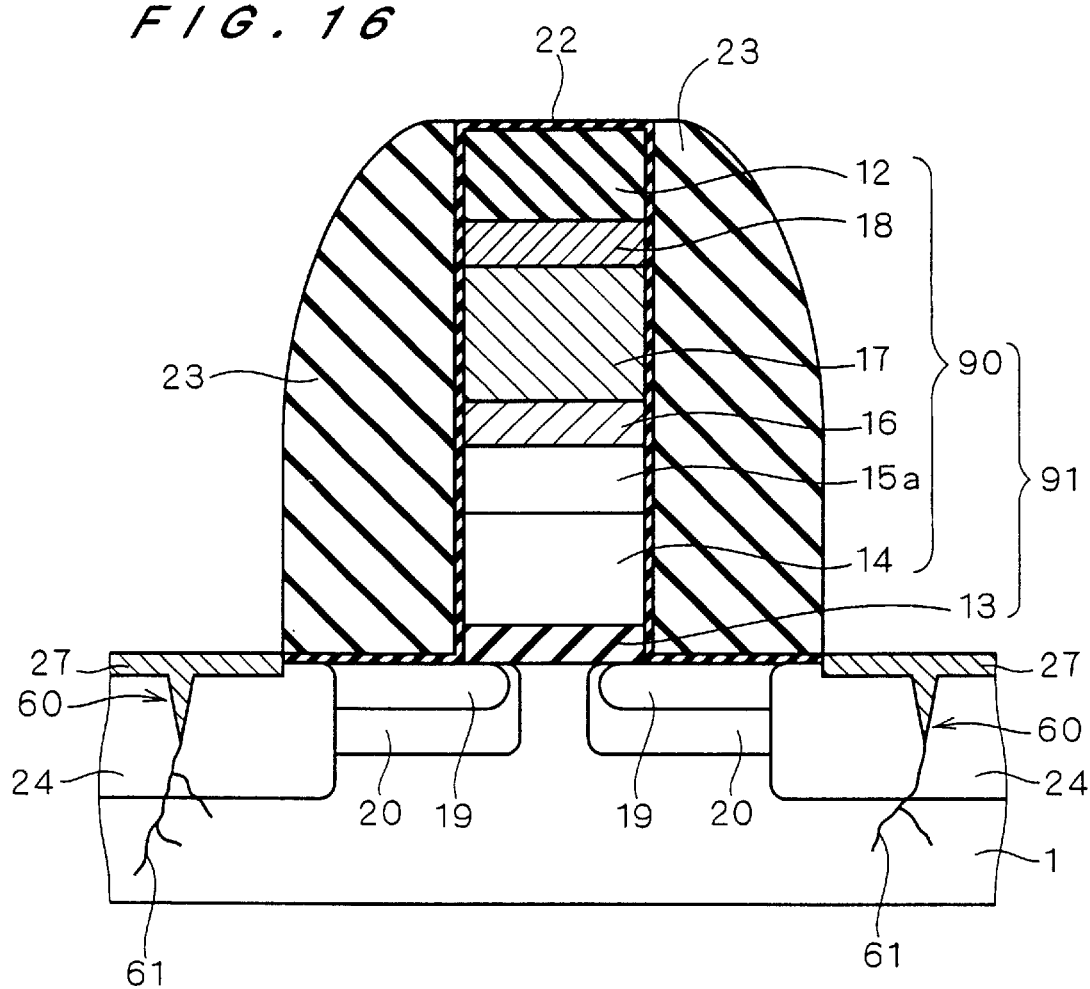
FIG. 16 is a sectional view showing a situation causing spiky silicide parts or defects.

The native oxide films 25 are completely removed before forming the cobalt film 26, and hence the cobalt film 26 and the silicon substrate 1 uniformly react with each other in the heat treatment step for forming the cobalt silicide films 27. Therefore, it is possible to avoid occurrence of spiky silicide parts 60 and defects 61 (see FIG. 16) increasing a leakage current.

Thereafter the semiconductor device according to the embodiment 1 is completed through a step of forming interlayer isolation films and a wiring step.

A layer doped with nitrogen atoms in a high concentration (at least $1 \times 10^{20}/cm^3$) may be formed by ion implantation in the vicinity of the interface between the silicon oxide film 2 and the polysilicon film 3a or the doped polysilicon film 3b or in the vicinity of the interface between the gate insulator film 13 and the doped polysilicon layer 14. The ion implantation for forming such a layer may be performed in any stage after forming the polysilicon film 3a in FIG. 1, after forming the polysilicon-germanium film 6a in FIG. 3 or after forming the gate structure 91 in FIG. 8.

The following effects can be attained by forming the layer doped with the nitrogen atoms in a high concentration: Also when the thicknesses of the silicon oxide film 2 and the gate insulator film 13 are reduced due to dispersion in film formation quantity or the like, it is possible to inhibit the impurity introduced into the doped polysilicon film 3b or the doped polysilicon layer 14 from passing through the silicon oxide film 2 or the gate insulator film 13 and diffusing into the silicon substrate 1 by the heat treatment. Consequently, fluctuation of the threshold voltage of a transistor caused by such diffusion of the impurity can be suppressed.

In the method of manufacturing a semiconductor device according to the embodiment 1, the semiconductor layer of the polymetal gate is formed by the doped polysilicon-germanium layer 15a and the doped polysilicon layer 14. As described above, polysilicon-germanium has a higher impurity activation rate than polysilicon. In the semiconductor device according to the embodiment 1, therefore, resistance of the semiconductor layer of the polymetal gate can be reduced as compared with a semiconductor device comprising a polymetal gate having a semiconductor layer consisting of only doped polysilicon. Consequently, the resistance of the polymetal gate can be reduced as a whole.

The threshold voltage of the MOSFET can be set to a desired value by adjusting the ratio of the thickness of the polysilicon-germanium film 6a to that of the polysilicon film 3a and the composition ratio of $Si_{1-x}Ge_x$ in the polysilicon-germanium film 6a.

In the method of manufacturing a semiconductor device according to the embodiment 1, further, the doped polysilicon-germanium film 6b or the doped polysilicon-germanium layer 15a is formed in contact with the barrier film 7 or the barrier layer 16. Also when the impurity contained in the doped polysilicon-germanium film 6b or the doped polysilicon-germanium layer 15a partially thermally diffuses into the barrier film 7 or the barrier layer 16 due to the heat treatment, therefore, a large quantity of activated impurity remains in the semiconductor layer of the polymetal gate in the vicinity of the interface therebetween. Consequently, partial depletion of the layer doped with the impurity is small and it is possible to inhibit increase of the resistance of the polymetal gate as a whole.

Further, the following effects can be attained by applying the present invention (forming the doped polysilicon-germanium layer) in relation to not a polycide gate but the polymetal gate: As a first effect, the gate resistance can be reduced since a metal has smaller resistivity than metal silicide. As a second effect, deterioration of performance resulting from electromigration can be suppressed and reliability of a gate electrode can be increased since a metal has higher thermal conductivity than metal silicide. As a third effect, increase of interfacial level density (surface state density) resulting from difference in linear expansion coefficient following the heat treatment step can be suppressed since a metal such as W, Mo, Ti or Ta has a linear expansion coefficient closer to that of Si or SiGe than metal silicide thereof. As a fourth effect, interfacial resistance can be reduced in relation to the interface between the metal film and the doped polysilicon-germanium film since a diffusion coefficient of a dopant in the metal is smaller than that in the metal silicide.

Figure 17:
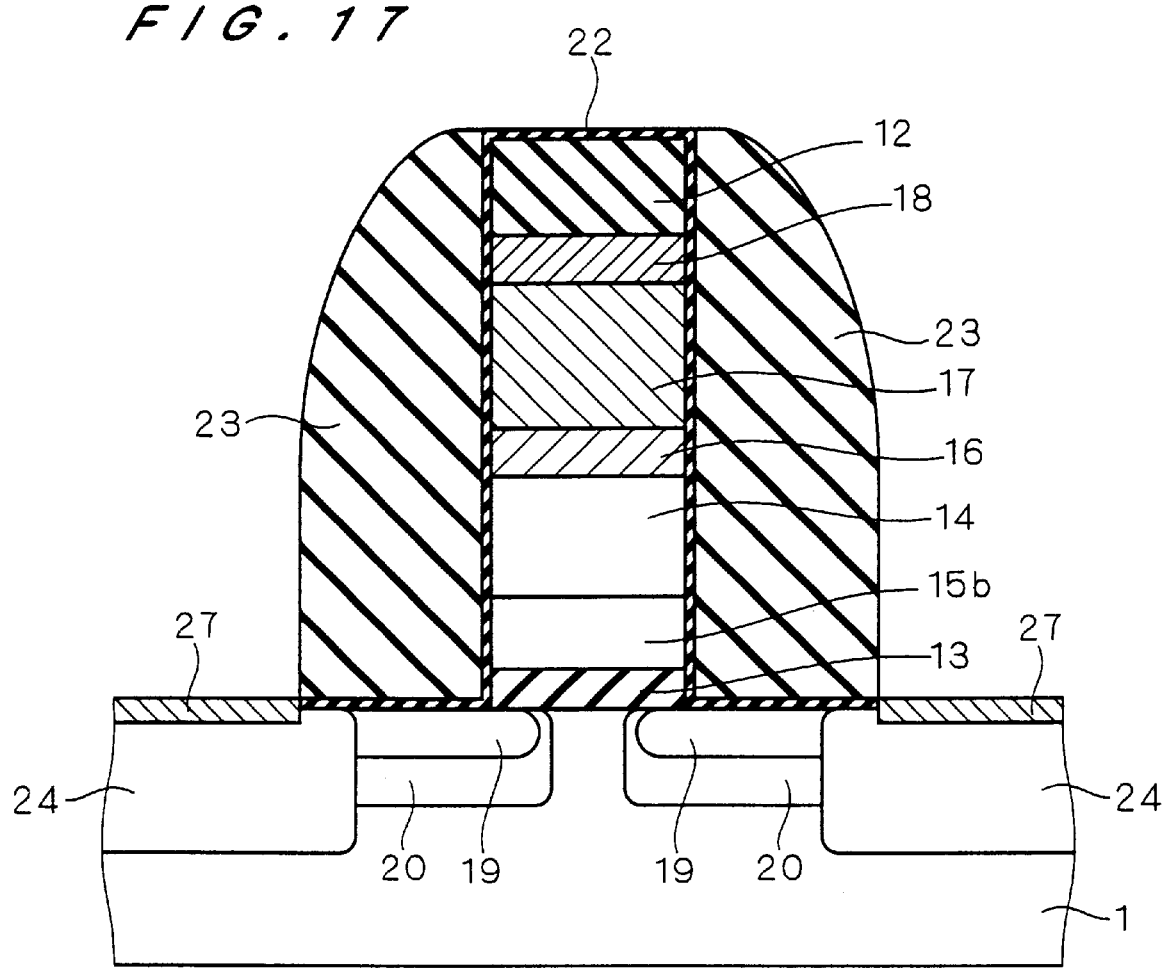
FIG. 17 is a sectional view showing the structure of a semiconductor device according to a first modification of the embodiment 1 of the present invention.

FIG. 17 is a sectional view showing the structure of a semiconductor device according to a first modification of the embodiment 1 of the present invention. A semiconductor layer of a polymetal gate is formed by a doped polysilicon layer 14 in contact with a barrier layer 16 and a doped polysilicon-germanium layer 15b held between the same and a gate insulator film 13 in contact therewith. Such a structure can be obtained by reversing the order of forming the doped polysilicon film 3b and the doped polysilicon-germanium film 6b in the steps shown in FIGS. 1 to 4.

Figure 18:
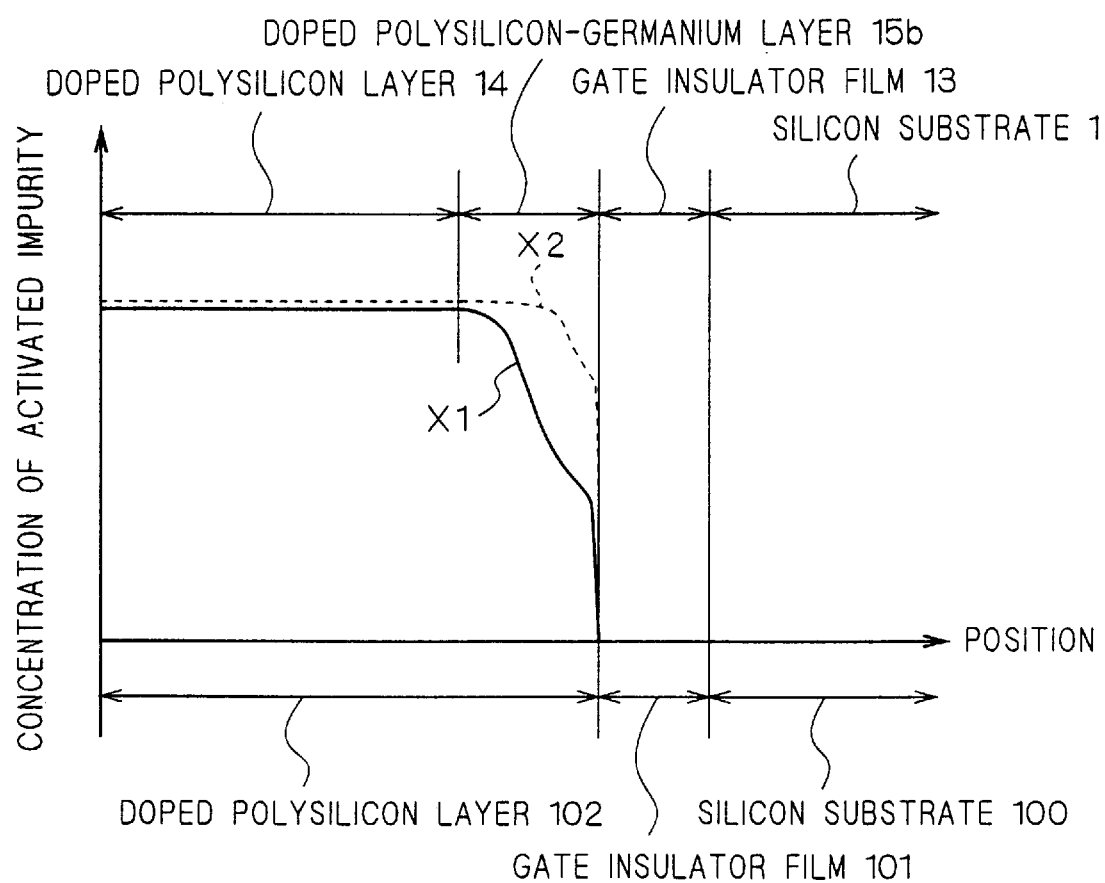
FIG. 18 is a graph for illustrating effects of a method of manufacturing the semiconductor device according to the first modification of the embodiment 1 of the present invention.

In the method of manufacturing a semiconductor device according to the first modification of the embodiment 1, resistance can be reduced as compared with a polymetal gate having a semiconductor layer consisting of only doped polysilicon similarly to the above, the threshold voltage of a MOSFET can be set to a desired value, and the following effects can be attained:

FIG. 18 is a graph for illustrating effects of the method of manufacturing a semiconductor device according to the first modification of the embodiment 1 of the present invention. The vertical axis of the graph shows the concentrations of activated impurities, and the horizontal axis shows positions of the semiconductor layer of the polymetal gate, the gate insulator film and the silicon substrate along the depth direction. A solid line X1 shows characteristics related to the conventional semiconductor device, and a broken line X2 shows characteristics related to the semiconductor device according to the first modification of the embodiment 1 of the present invention.

In the method of manufacturing a semiconductor device according to the first modification of the embodiment 1, formed in contact with the silicon oxide film 2 or the gate insulator film 13 is not the doped polysilicon film 3b or the doped polysilicon layer 14 but the doped polysilicon-germanium film 6b or the doped polysilicon-germanium layer 15b. Also when the impurity contained in the doped polysilicon-germanium film 6b or the doped polysilicon-germanium layer 15b partially thermally diffuses into the silicon oxide film 2 or the gate insulator film 13 due to heat treatment, therefore, a large quantity of activated impurity remains in the doped polysilicon-germanium layer 15b in the vicinity of the interface between the same and the gate insulator film 13, as shown in the graph of FIG. 18. Consequently, partial depletion of the layer doped with the impurity is small and it is possible to suppress increase of the resistance of the polymetal gate.

Figure 19:
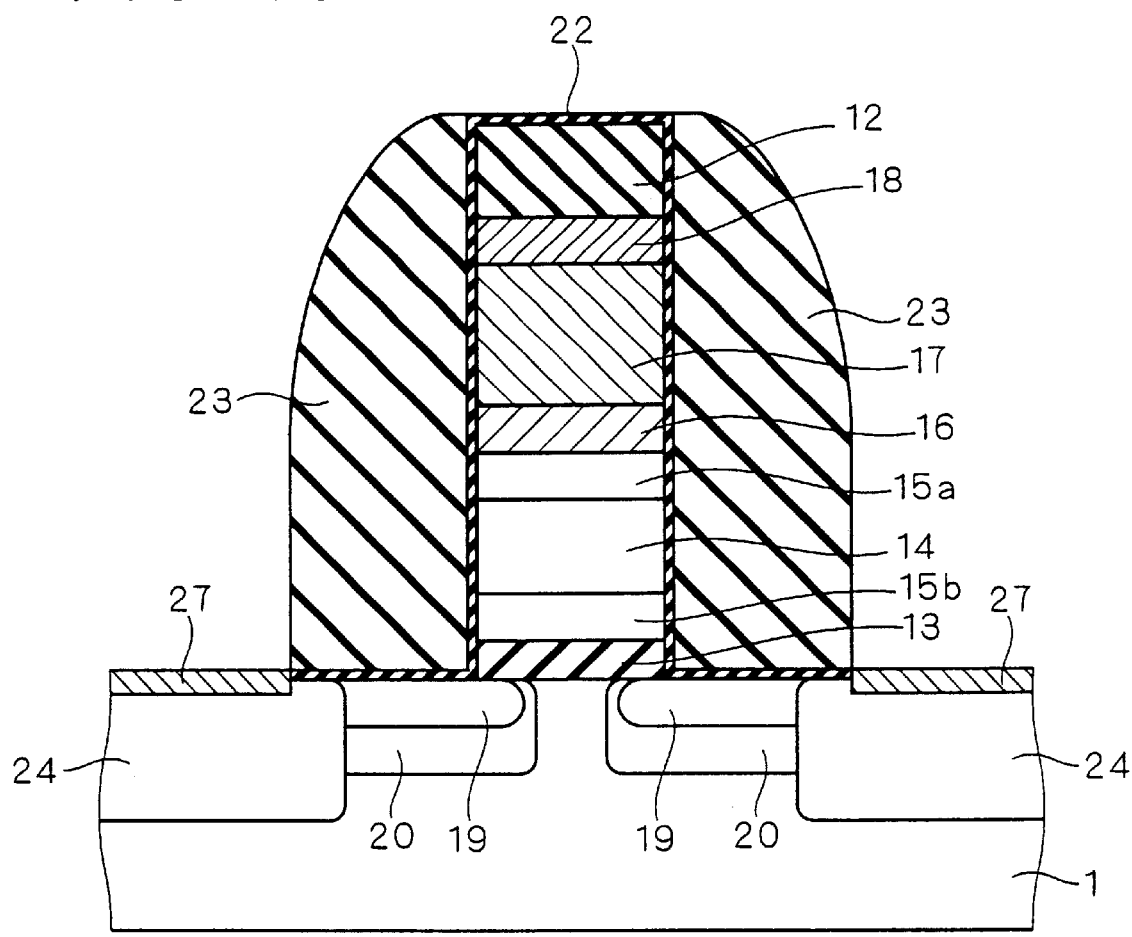
FIG. 19 is a sectional view showing the structure of a semiconductor device according to a second modification of the embodiment 1 of the present invention.

FIG. 19 is a sectional view showing the structure of a semiconductor device according to a second modification of the embodiment 1 of the present invention. A semiconductor layer of a polymetal gate is formed by a doped polysilicon-germanium layer 15a in contact with a barrier layer 16, a doped polysilicon-germanium layer 15b in contact with a gate insulator film 13 and a doped polysilicon layer 14 held between the doped polysilicon-germanium layer 15a and the doped polysilicon-germanium layer 15b in contact therewith. Such a structure can be obtained by forming the doped polysilicon-germanium film 6b on the silicon oxide film 2 before forming the polysilicon film 3a in the step shown in FIG. 1.

In the method of manufacturing a semiconductor device according to the second modification of the embodiment 1, both of the effects of the method of manufacturing a semiconductor device according to the embodiment 1 and those of the method of manufacturing a semiconductor device according to the first modification of the embodiment 1 can be obtained. As an effect, partial depletion of the layer doped with the impurity can be suppressed in both of the interface between the same and the barrier film 7 or the barrier layer 16 and the interface between the same and the silicon oxide film 2 or the gate insulator film 13.

Figure 20:
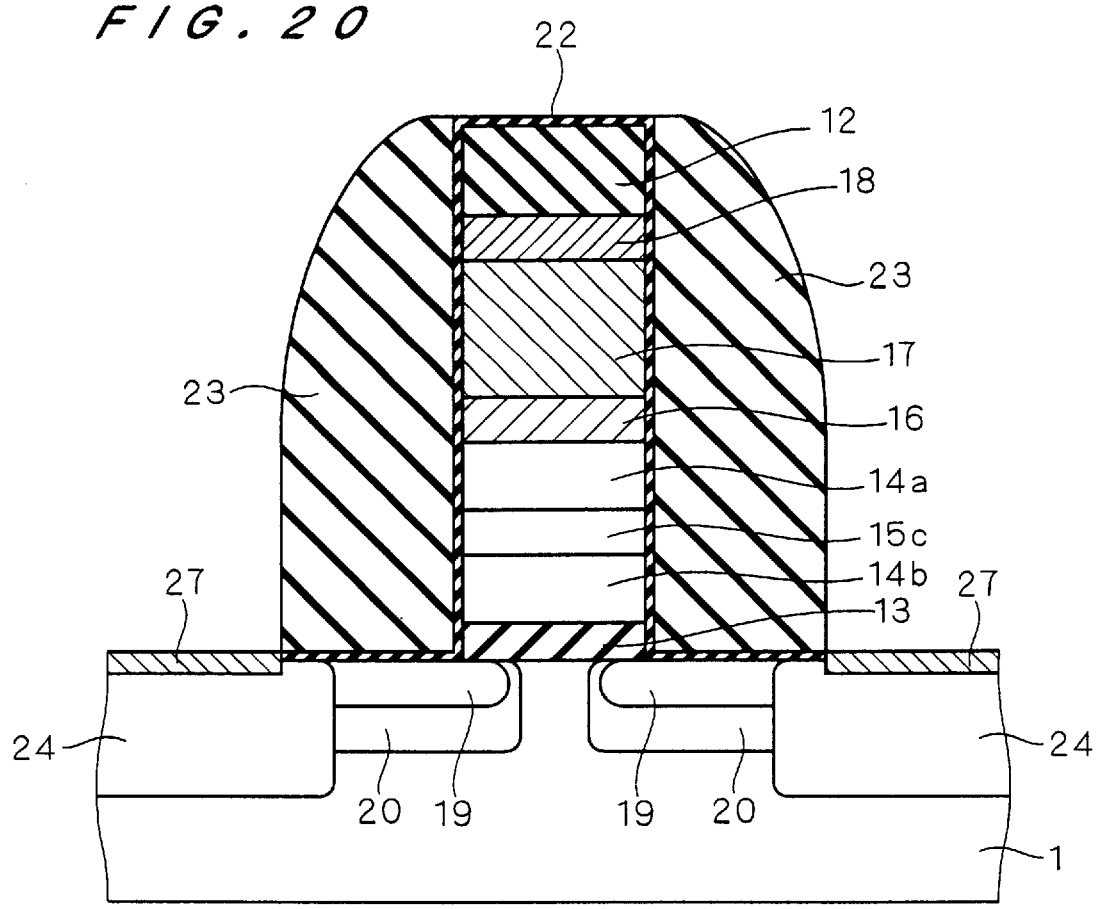
FIG. 20 is a sectional view showing the structure of a semiconductor device according to a third modification of the embodiment 1 of the present invention.

FIG. 20 is a sectional view showing the structure of a semiconductor device according to a third modification of the embodiment 1 of the present invention. A semiconductor layer of a polymetal gate is formed by a doped polysilicon layer 14a in contact with a barrier layer 16, another doped polysilicon layer 14b in contact with a gate insulator film 13 and a doped polysilicon-germanium layer 15c held between the doped polysilicon layers 14a and 14b in contact therewith. The doped polysilicon-germanium layer 15c is formed around the thickness center of the semiconductor layer of the polymetal gate, for example, and the thickness thereof is about 20 to 50 nm. Such a structure can be obtained by forming the doped polysilicon-germanium film 6b in the step shown in FIG. 4 and thereafter further forming the doped polysilicon film 3a on the doped polysilicon-germanium film 6b.

In the method of manufacturing a semiconductor device according to the third modification of the embodiment 1, it is possible to attain such an effect that resistance can be reduced as compared with a polymetal gate having a semiconductor layer consisting of only doped polysilicon and such an effect that the threshold voltage of a MOSFET can be set to a desired value among the effects attained by the method of manufacturing a semiconductor device according to the embodiment 1.

Figure 21:
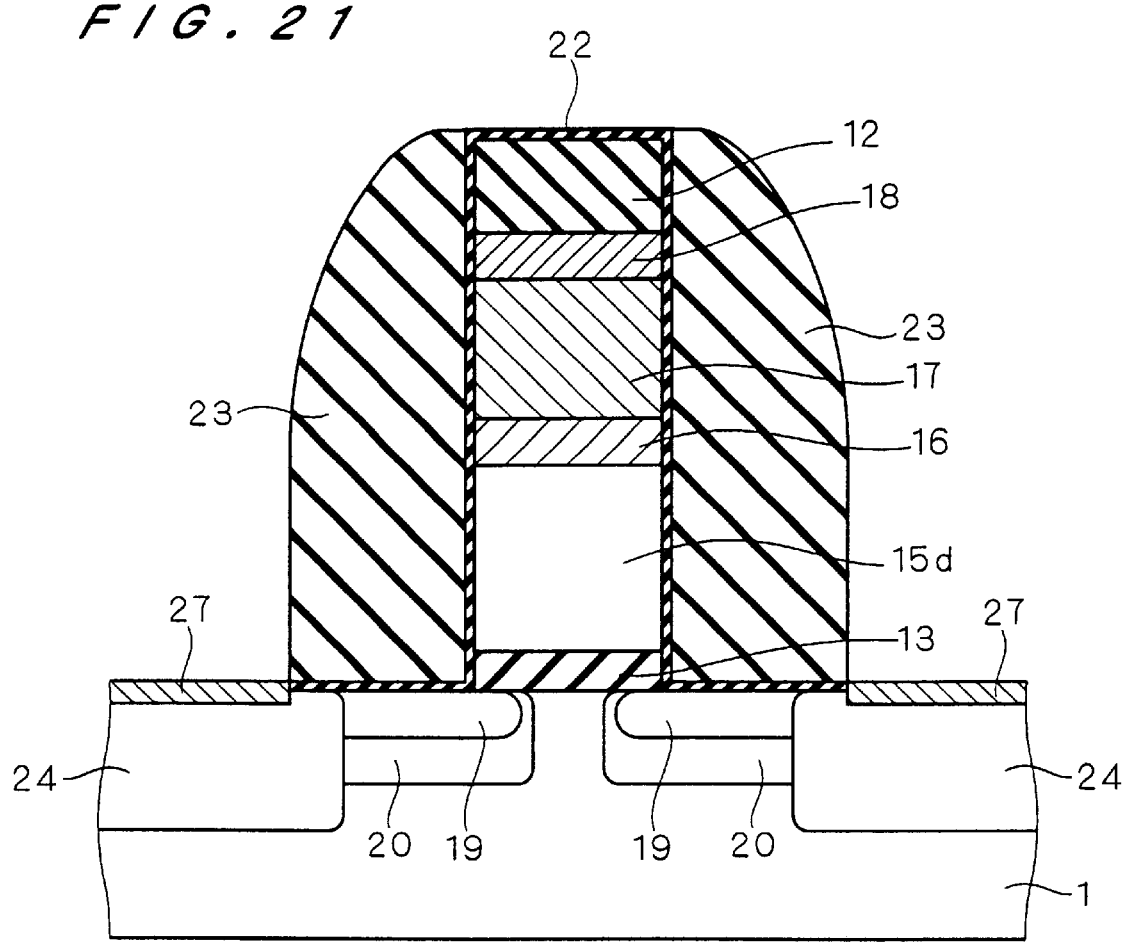
FIG. 21 is a sectional view showing the structure of a semiconductor device according to a fourth modification of the embodiment 1 of the present invention.

FIG. 21 is a sectional view showing the structure of a semiconductor device according to a fourth modification of the embodiment 1 of the present invention. A semiconductor layer of a polymetal gate is formed not as a multilayer film of a doped polysilicon layer and a doped polysilicon-germanium layer but only by a doped polysilicon-germanium layer 15d. Such a structure can be obtained by omitting the step (FIG. 1) of forming the polysilicon film 3a and thickly forming the polysilicon-germanium film 6a on the silicon oxide film 2 in the step shown in FIG. 3.

In the method of manufacturing a semiconductor device according to the fourth modification of the embodiment 1, the semiconductor layer of the polymetal gate is formed only by the doped polysilicon-germanium layer 15d having a higher impurity activation rate than polysilicon. As compared with the conventional semiconductor device and the semiconductor devices according to the embodiment 1 (and the first to third modifications thereof), therefore, resistance of the semiconductor layer of the polymetal gate can be further reduced.

It is also possible to set the threshold voltage of a MOSFET to a desired value by adjusting the composition ratio of $Si_{1-x}Ge_x$ in the polysilicon-germanium film 6a. Further, partial depletion of the layer doped with the impurity can be suppressed in both of the interface between the same and the barrier film 7 or the barrier layer 16 and the interface between the same and the silicon oxide film 2 or the gate insulator film 13.

Embodiment 2.

FIGS. 22 to 28 are sectional views showing a method of manufacturing a semiconductor device according to an embodiment 2 of the present invention in step order. First, a silicon oxide film 2 is formed on the overall surface of a silicon substrate 1 by thermal oxidation or the like. Then, a doped polysilicon film 3 is deposited on the overall surface of the silicon oxide film 2 by CVD. A native oxide film 4 is formed on the surface of the doped polysilicon film 3.

Figure 22:
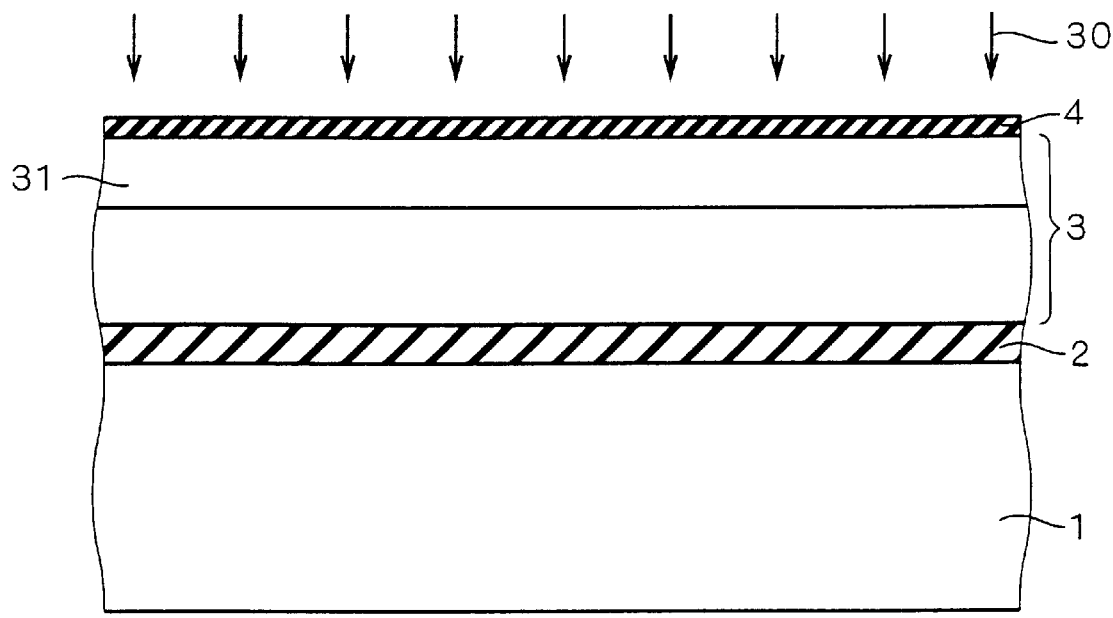
FIGS. 22 to 28 are sectional views showing a method of manufacturing a semiconductor device according to an embodiment 2 of the present invention in step order.

Then, noble gas atoms 30 of argon or the like are introduced into the upper portion of the doped polysilicon film 3 by ion implantation for forming a noble gas atom introduction layer 31 (FIG. 22). The noble gas atoms 30 are implanted under conditions of implantation energy of 1 to 50 keV and a dose of $1 \times 10^{13}$ to $1 \times 10^{16}/cm^2$. Due to this ion implantation, the noble gas atom introduction layer 31 approaches an amorphous state.

In this case, the noble gas atoms 30 may be introduced by performing ion implantation a plurality of times at different implantation energy levels. Thus, the concentration of the noble gas atoms 30 contained in the noble gas atom introduction layer 31 can be uniformalized along the depth. This also applies to introduction of noble gas atoms 33 and 35 described later.

Alternatively, the noble gas atom introduction layer 31 may be formed not by ion implantation but by deposition, by mixing noble gas into raw material gas in a final stage of CVD when depositing the doped polysilicon film 3 by CVD.

Then, heat treatment is performed for causing crystal grain growth in the noble gas atom introduction layer 31 and increasing the crystal grain size of polysilicon. Also when not performing the heat treatment for crystal grain growth in this stage, crystal grain growth is caused in the noble gas atom introduction layer 31 by heat treatment for forming source/drain regions 24 or the like later.

Figure 23:
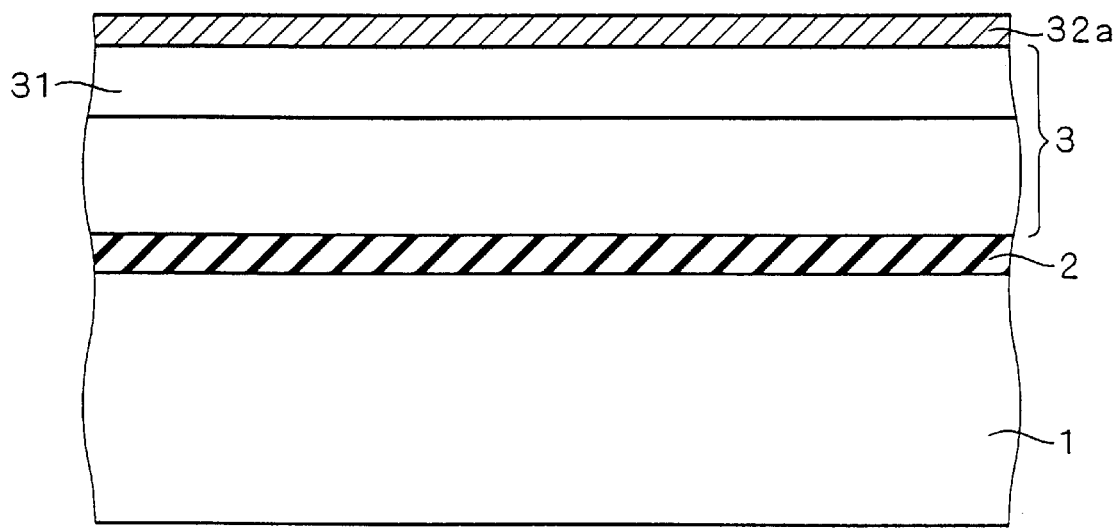
Figure 24:
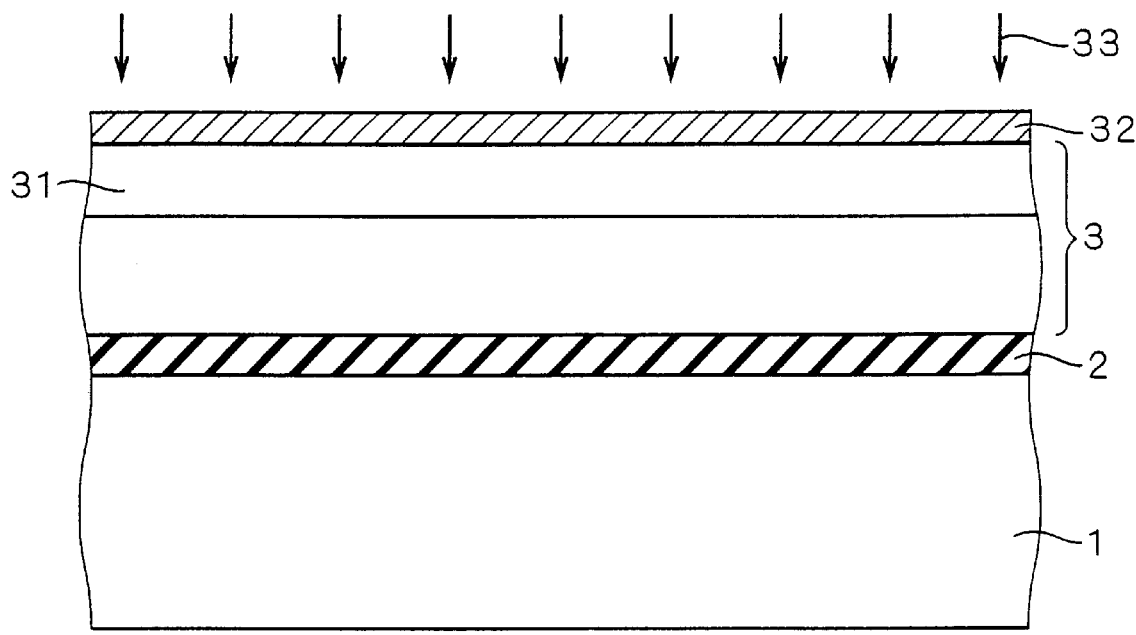

Then, the native oxide film 4 is removed and thereafter a barrier film 32a is formed on the overall surface of the doped polysilicon film 3 by PVD or the like in a thickness of about 10 nm (FIG. 23). Then, the noble gas atoms 33 of argon or the like are introduced into the barrier film 32a by ion implantation for forming a barrier film 32 (FIG. 24). The noble gas atoms 33 are implanted under conditions of implantation energy of 50 to 120 keV and a dose of $1\times10^{13}$ to $1\times10^{16}/cm^2$.

The barrier film 32 may not be formed by ion implantation but may alternatively be formed by sputter deposition with a target mixed with the noble gas atoms 33 after removing the native oxide film 4.

Figure 25:
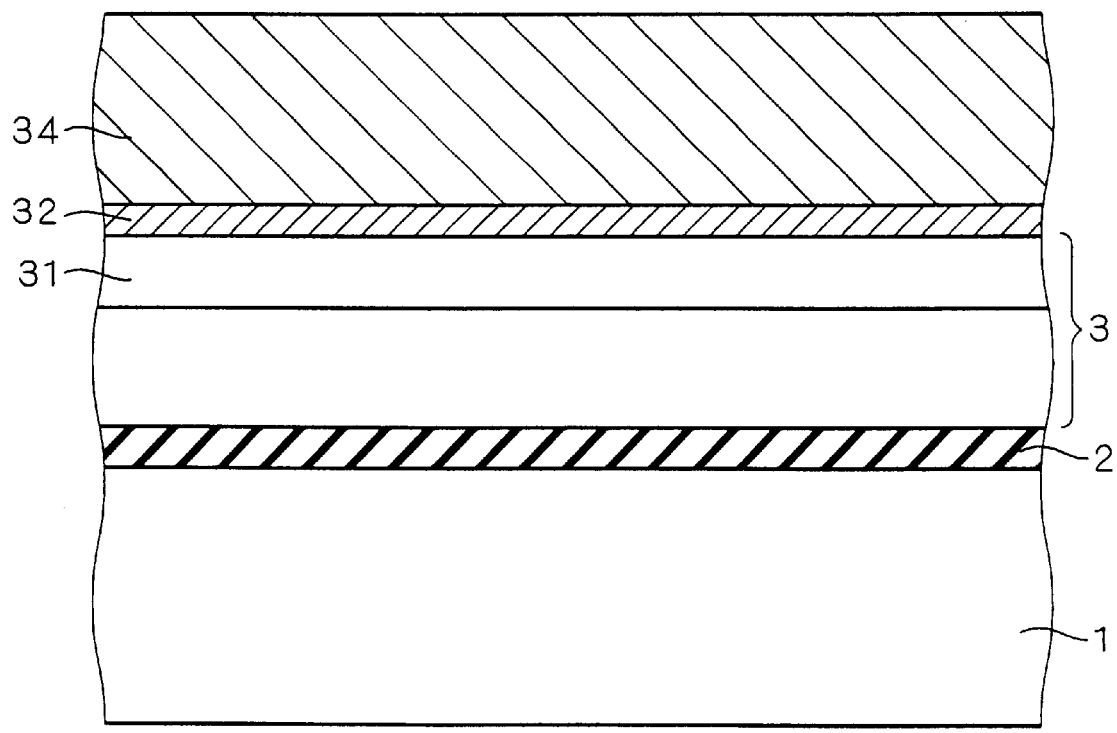

Then, a metal film 34 is formed on the overall surface of the barrier film 32 by PVD in a thickness of about 100 nm (FIG. 25). When forming the barrier film 32 by ion implantation, the barrier film 32 approaches an amorphous state. Therefore, the metal film 34 having a large crystal grain size can be formed on the barrier film 32 with no influence by the crystal plane of the underlayer.

Figure 26:
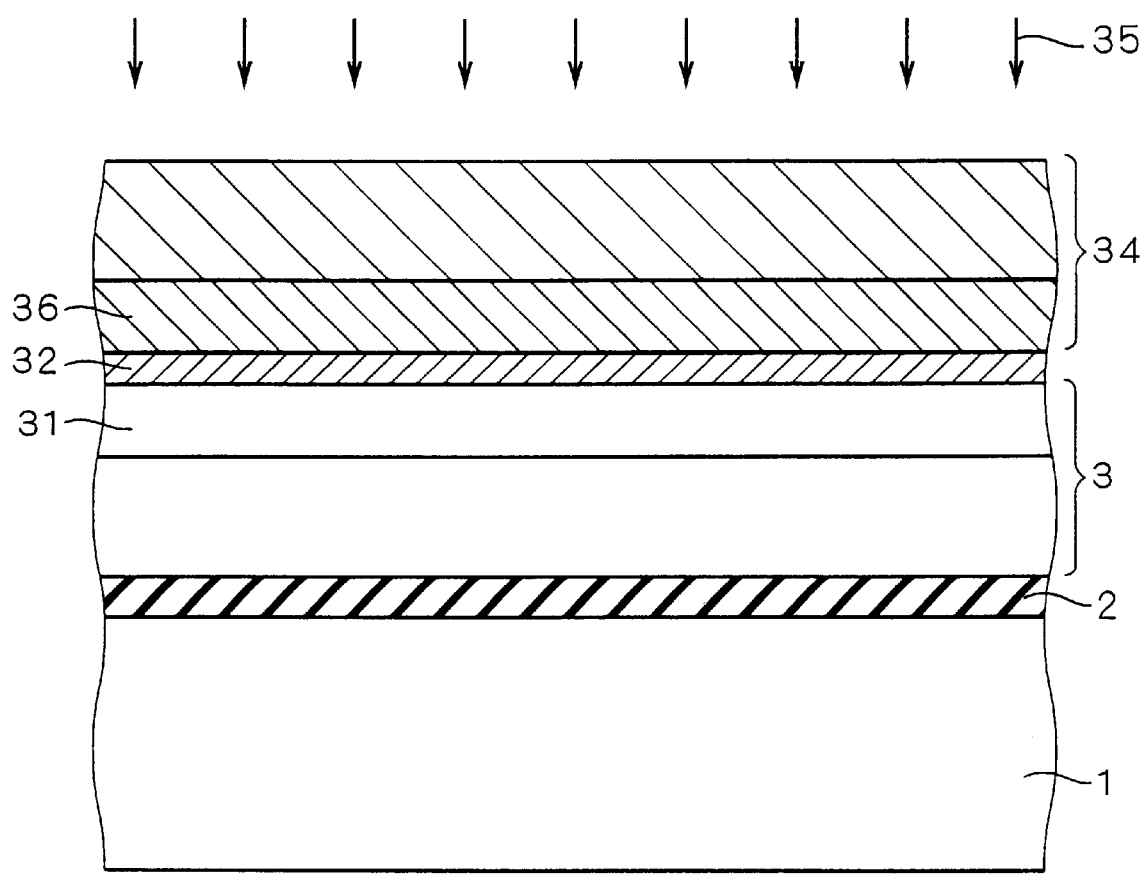

Then, the noble gas atoms 35 of argon or the like are introduced into the bottom portion of the metal film 34 by ion implantation for forming a noble gas atom introduction layer 36 (FIG. 26). The noble gas atoms 35 are implanted under conditions of implantation energy of 120 to 160 keV and a dose of $1\times10^{13}$ to $1\times10^{16}/cm^2$.

Subsequent steps are similar to those of the method of manufacturing a semiconductor device according to the embodiment 1. First, a barrier film 9 is formed on the metal film 34, an insulator film 10 is formed on the barrier film 9, and thereafter an ARC 11 is formed on the insulator film 10. Then, a photoresist film 50 is formed on a portion of the ARC 11 located on a region formed with a gate electrode later. Then, the photoresist film 50 is employed as an etching mask for removing the ARC 11 and the insulator film 10 in this order by etching. Then, the photoresist film 50 and the ARC 11 located under the same are removed thereby obtaining an insulator film 12 as the insulator film 10 left unetched. Then, the insulator film 12 is employed as a hard mask for removing parts of the barrier film 9, the metal film 34, the barrier film 32, the doped polysilicon film 3 and the silicon oxide film 2 exposed from the insulator film 12 in this order by etching.

Thus, a barrier layer 18, a metal layer 40, another barrier layer 39, a doped polysilicon layer 37 and a gate insulator film 13 are obtained as the barrier film 9, the metal film 34, the barrier film 32, the doped polysilicon film 3 and the silicon oxide film 2 left unetched. Further, noble gas atom introduction layers 38 and 41 are obtained as the noble gas atom introduction layers 31 and 36 left unetched.

Figure 27:
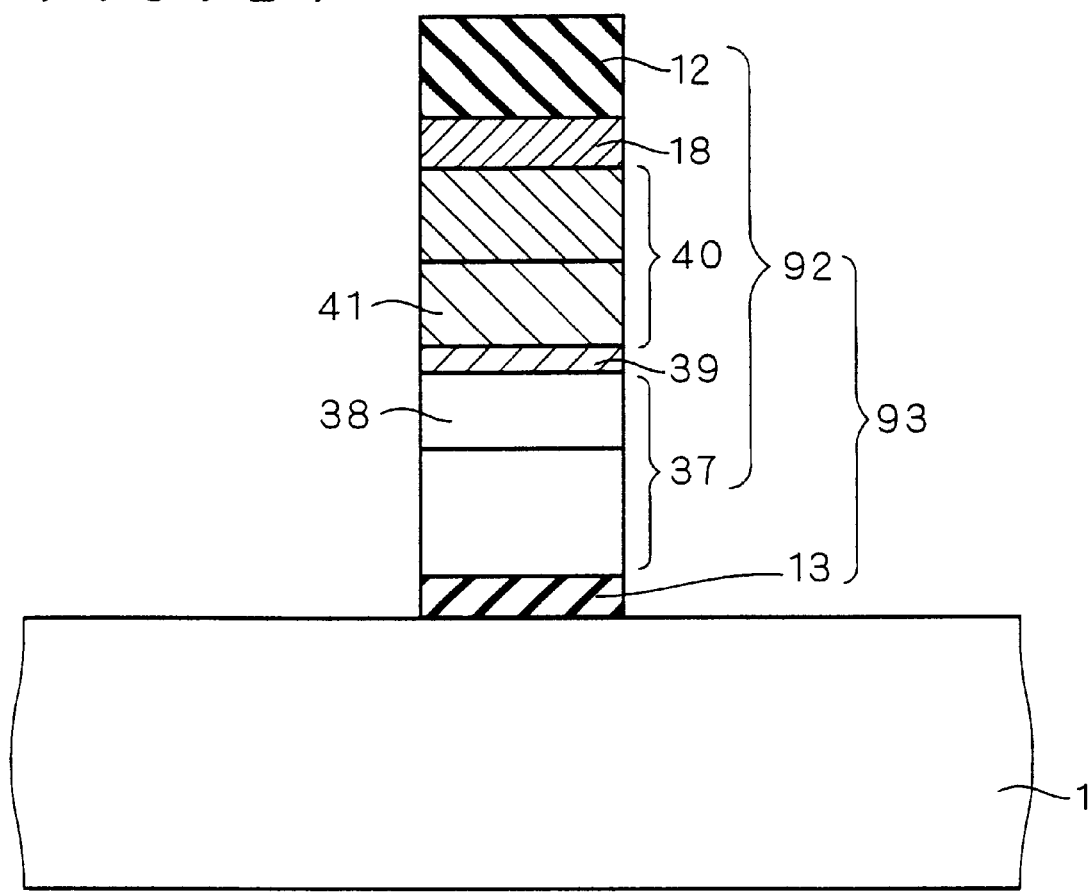

Through the aforementioned steps, it is possible to selectively form a gate structure 93 having the gate insulator film 13 and a gate electrode 92 formed on the gate insulator film 13 and having a multilayer structure obtained by stacking the doped polysilicon layer 37, the barrier layer 39, the metal layer 40, the barrier layer 18 and the insulator film 12 in this order on the upper surface of the silicon substrate 1 (FIG. 27). In the gate electrode 92, the doped polysilicon layer 37 having the noble gas atom introduction layer 38 thereon serves as a semiconductor layer of a polymetal gate.

Figure 28:
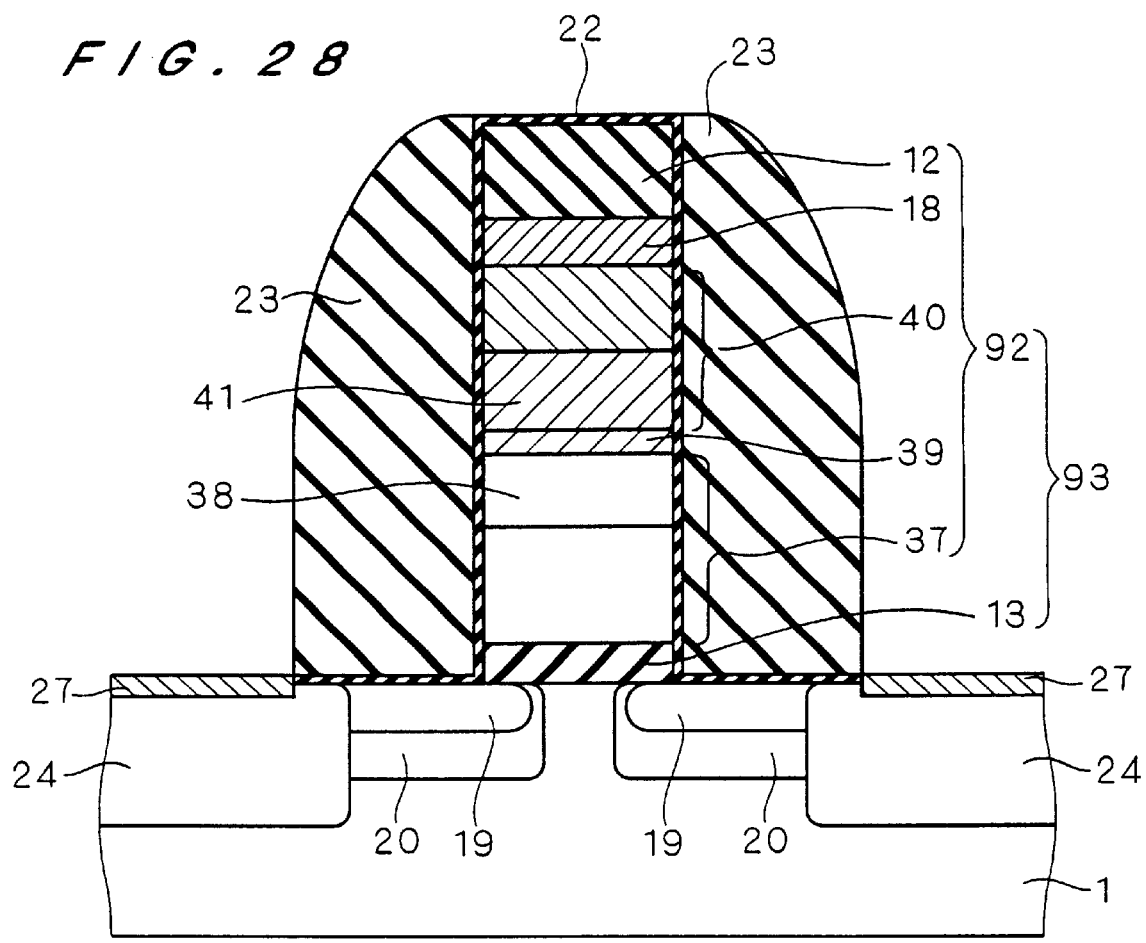
Figure 29:
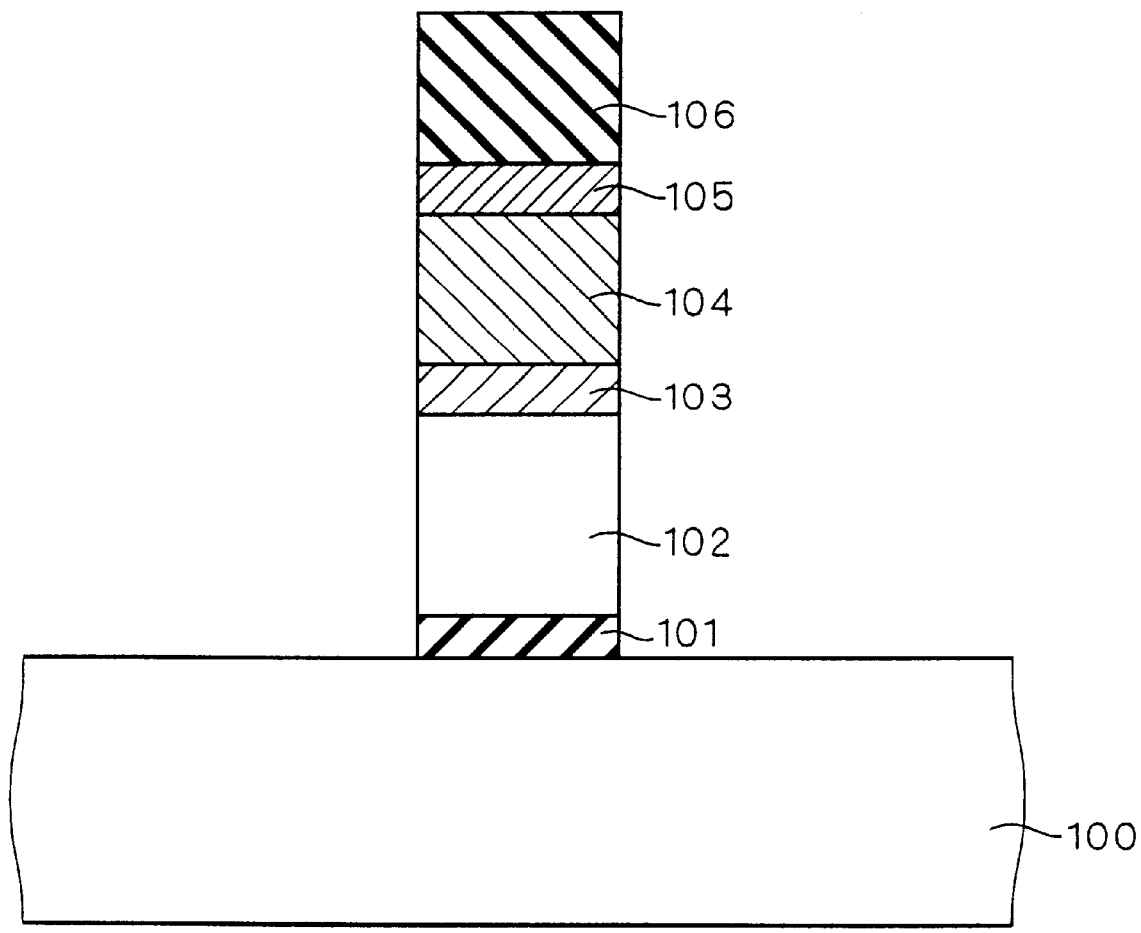
FIG. 29 is a sectional view showing the structure of a conventional semiconductor device.

Then, extensions 19 and pocket implantation layers 20 are formed in the upper surface of the silicon substrate 1. Then, an insulator film 22 is formed by re-oxidizing the gate, and thereafter side walls 23 are formed on the side surfaces of the gate structure 93 through the insulator film 22. Then, source/drain regions 24 are formed by ion implantation through the gate structure 93 and the side walls 23 serving as implantation masks. Then, native oxide films 25 formed on the upper surface of the silicon substrate 1 are removed and thereafter a metal film such as a cobalt film 26 is formed on the overall surface. Then, a portion of the cobalt film 26 in contact with the upper surface of the silicon substrate 1 is reacted with the silicon substrate 1 by heat treatment for forming a cobalt silicide film 27. Then, a cobalt nitride film and the unreacted portion of the cobalt film 26 are removed by etching (FIG. 28). Thereafter the semiconductor device according to the embodiment 2 is completed through a step of forming interlayer isolation films and a wiring step.

Similarly to the embodiment 1, a layer doped with nitrogen atoms in a high concentration (at least $1\times10^{20}/cm^3$) may be formed by ion implantation in the vicinity of the interface between the silicon oxide film 2 and the doped polysilicon film 3 or in the vicinity of the interface between the gate insulator film 13 and the doped polysilicon layer 37.

While the noble gas atoms 30, 33 and 35 are prepared from argon atoms in the above description, atoms of any of helium, neon, xenon, krypton and radon may be employed in place of the argon atoms.

In the method of manufacturing a semiconductor device according to the embodiment 2, the noble gas atom introduction layer 31 is formed in the doped polysilicon film 3 in the vicinity of the interface between the same and the barrier film 32 while the noble gas atom introduction layer 38 is formed in the doped polysilicon layer 37 in the vicinity of the interface between the same and the barrier layer 39. Further, the barrier film 32 doped with the noble gas atoms is formed on the doped polysilicon film 3 and the barrier layer 39 doped with the noble gas atoms is formed on the doped polysilicon layer 37. In addition, the noble gas atom introduction layer 36 is formed in the metal film 34 in the vicinity of the interface between the same and the barrier film 32 while the noble gas atom introduction layer 41 is formed in the metal layer 40 in the vicinity of the interface between the same and the barrier layer 39.

Also when metal atoms contained in the barrier film 32 or the metal film 34 diffuse into the doped polysilicon film 3, metal atoms contained in the barrier layer 39 or the metal layer 40 diffuse into the doped polysilicon layer 37, silicon atoms contained in the doped polysilicon film 3 diffuse into the barrier film 32 or the metal film 34 or silicon atoms contained in the doped polysilicon layer 37 diffuse into the barrier layer 39 or the metal layer 40, therefore, it is possible to inhibit the metal atoms and the silicon atoms from reacting with each other and forming metal silicide. Consequently, increase of contact resistance on the interface between the aforementioned films or layers can be suppressed and increase of gate resistance can be suppressed as a whole.

When introducing the noble gas atoms 30 into the doped polysilicon film 3 by ion implantation as shown in FIG. 22, the crystal grain size of polysilicon in the noble gas atom introduction layer 31 is increased by later heat treatment. Therefore, the number of impurities arrangeable on crystal lattice positions is increased and the impurity activation rate is increased. Therefore, the resistance of the doped polysilicon layer 37 can be reduced for reducing the gate resistance.

When forming the barrier film 32 by ion implantation as shown in FIG. 24, the barrier film 32 approaches an amorphous state and hence it is possible to form a metal film 34 having a large crystal grain size on the barrier film 32. Consequently, the number of grain boundaries per unit volume is reduced in relation to the metal layer 40, whereby the resistance of the metal layer 40 can be reduced for reducing the gate resistance.

While the above description has been made with reference to the case of carrying out all of the step of introducing the noble gas atoms 30 into the upper surface of the doped polysilicon film 3, the step of introducing the noble gas atoms 33 into the barrier film 32a and the step of introducing the noble gas atoms 35 into the bottom surface of the metal film 34, arbitrary one or two of these steps may alternatively be executed in response to target effects.

It is possible to attain the respective effects by carrying out the method of manufacturing a semiconductor device according to the embodiment 2 in combination with the methods of manufacturing a semiconductor device according to the embodiment 1 (and the first to fourth modifications thereof), as a matter of course.

In each of the aforementioned embodiments 1 and 2, the silicon-germanium layer may be either polycrystalline or single-crystalline, for attaining similar effects.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device comprising steps of:
   (a) forming a gate insulator film on a main surface of a semiconductor substrate;
   (b) forming a first semiconductor film on said gate insulator film,
   said first semiconductor film being doped with a prescribed impurity and having partially a layer consisting of a material having a higher impurity activation rate than polysilicon;
   (c) forming a barrier film on said first semiconductor film;
   (d) forming a metal film on said barrier film; and
   (e) selectively removing said metal film, said barrier film and said first semiconductor film in this order thereby forming a gate electrode,
   wherein said step (b) includes steps of:
      (b-1) forming a second semiconductor film consisting of said material as said layer; and
      (b-2) forming a third semiconductor film different in impurity activation rate from said second semiconductor film.

2. The method of manufacturing a semiconductor device according to claim 1, wherein
   said second semiconductor film is formed in at least either a part including the interface between the same and said barrier film or a part including the interface between the same and said gate insulator film.

3. The method of manufacturing a semiconductor device according to claim 1, further comprising a step (f) of introducing noble gas atoms into said first semiconductor film in the vicinity of the interface between the same and said barrier film.

4. The method of manufacturing a semiconductor device according to claim 1, further comprising a step (g) of introducing noble gas atoms into said metal film in the vicinity of the interface between the same and said barrier film.

5. The method of manufacturing a semiconductor device according to claim 1, further comprising a step (h) carried out in advance of said step (d) for introducing noble gas atoms into said barrier film.

6. The method of manufacturing a semiconductor device according to claim 5, wherein
   said noble gas atoms are introduced into said barrier film by ion implantation in said step (h).

7. The method of manufacturing a semiconductor device according to claim 1, wherein
   said layer is an $Si_{1-x}Ge_x$ layer having a composition ratio of $0.2 \leq x \leq 0.4$.

* * * * *

UNITED STATES PATENT AND TRADEMARK OFFICE
CERTIFICATE OF CORRECTION

PATENT NO. : 6,465,335 B1
DATED : October 15, 2002
INVENTOR(S) : Tatsuya Kunikiyo It is certified that error appears in the above-identified patent and that said Letters Patent is hereby corrected as shown below:

<u>Title page,</u>
Item [56], OTHER PUBLICATIONS, change "IEEE" to -- IEDM --.

<u>Column 8,</u>
Line 3, change "$8 \times 10^2 1/cm^3$" to -- $8 \times 10^{20}/cm^3$ --.

Signed and Sealed this

Twenty-ninth Day of April, 2003

JAMES E. ROGAN
*Director of the United States Patent and Trademark Office*